(12) United States Patent
Poupyrev

(10) Patent No.: US 9,983,747 B2
(45) Date of Patent: May 29, 2018

(54) TWO-LAYER INTERACTIVE TEXTILES

(71) Applicant: Google Inc., Mountain View, CA (US)

(72) Inventor: Ivan Poupyrev, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 0 days. days.

(21) Appl. No.: 14/959,730

(22) Filed: Dec. 4, 2015

(65) Prior Publication Data

US 2016/0282988 A1 Sep. 29, 2016

Related U.S. Application Data

(60) Provisional application No. 62/138,831, filed on Mar. 26, 2015.

(51) Int. Cl.
*D03D 1/00* (2006.01)
*G06F 3/044* (2006.01)
(Continued)

(52) U.S. Cl.
CPC .......... *G06F 3/044* (2013.01); *D03D 1/0088* (2013.01); *D03D 25/005* (2013.01); *G06F 3/0416* (2013.01); *H03K 17/962* (2013.01); *D03D 2700/0166* (2013.01); *D10B 2401/16* (2013.01); *D10B 2401/18* (2013.01); *G06F 2203/04102* (2013.01); *G06F 2203/04103* (2013.01);
(Continued)

(58) Field of Classification Search
CPC ............... D03D 1/0088; D03D 25/005; D03D 2700/0166; D10B 2401/16; D10B 2401/18; G06F 2203/04102; G06F 2203/04103; G06F 2203/04111; G06F 3/0416; G06F 3/044; H01H 2203/0085
See application file for complete search history.

(56) References Cited

U.S. PATENT DOCUMENTS 3,610,874 A 10/1971 Gagliano
3,953,706 A 4/1976 Harris et al.
(Continued)

FOREIGN PATENT DOCUMENTS

CN 202887794 4/2013
CN 103355860 1/2016
(Continued)

OTHER PUBLICATIONS

"Final Office Action", U.S. Appl. No. 14/504,061, dated Mar. 9, 2016, 10 pages.
(Continued)

*Primary Examiner* — Ibrahim A Khan
(74) *Attorney, Agent, or Firm* — Colby Nipper

(57) ABSTRACT

This document describes two-layer interactive textiles. In one or more implementations, the interactive textile includes a top textile layer and a bottom textile layer. Conductive threads are woven into the top textile layer and the bottom textile layer. When the top textile layer is combined with the bottom textile layer, the conductive threads from each layer form a capacitive touch sensor that is configured to detect touch-input. The bottom textile layer is not visible and couples the capacitive through sensor to electronic components, such as a controller, a wireless interface, an output device (e.g., an LED, a display, or speaker), and so forth.

20 Claims, 23 Drawing Sheets

(51) Int. Cl.
*D03D 25/00* (2006.01)
*G06F 3/041* (2006.01)
*H03K 17/96* (2006.01)

(52) U.S. Cl.
CPC .............. *G06F 2203/04111* (2013.01); *H01H 2203/0085* (2013.01); *H01H 2239/006* (2013.01)

(56) References Cited

U.S. PATENT DOCUMENTS

| | | |
|---|---|---|
| 4,654,967 A | 4/1987 | Thenner |
| 4,700,044 A | 10/1987 | Hokanson et al. |
| 4,795,998 A * | 1/1989 | Dunbar .................. G01L 1/205 338/208 |
| 4,838,797 A | 6/1989 | Dodier |
| 5,298,715 A | 3/1994 | Chalco et al. |
| 5,341,979 A | 8/1994 | Gupta |
| 5,468,917 A | 11/1995 | Brodsky et al. |
| 5,564,571 A | 10/1996 | Zanotti |
| 5,656,798 A | 8/1997 | Kubo et al. |
| 5,724,707 A | 3/1998 | Kirk et al. |
| 5,798,798 A | 8/1998 | Rector et al. |
| 6,032,450 A | 3/2000 | Blum |
| 6,080,690 A | 6/2000 | Lebby et al. |
| 6,210,771 B1 * | 4/2001 | Post .................. D03D 15/00 139/1 R |
| 6,313,825 B1 | 11/2001 | Gilbert |
| 6,340,979 B1 | 1/2002 | Beaton et al. |
| 6,386,757 B1 | 5/2002 | Konno |
| 6,440,593 B2 | 8/2002 | Ellison et al. |
| 6,492,980 B2 | 12/2002 | Sandbach |
| 6,493,933 B1 | 12/2002 | Post et al. |
| 6,513,970 B1 | 2/2003 | Tabata et al. |
| 6,543,668 B1 | 4/2003 | Fujii et al. |
| 6,711,354 B2 | 3/2004 | Kameyama |
| 6,717,065 B2 | 4/2004 | Hosaka et al. |
| 6,802,720 B2 | 10/2004 | Weiss et al. |
| 6,835,898 B2 | 12/2004 | Eldridge et al. |
| 6,854,985 B1 | 2/2005 | Weiss |
| 6,929,484 B2 | 8/2005 | Weiss et al. |
| 7,134,879 B2 | 11/2006 | Sugimoto et al. |
| 7,164,820 B2 | 1/2007 | Eves et al. |
| 7,223,105 B2 | 5/2007 | Weiss et al. |
| 7,249,954 B2 | 7/2007 | Weiss |
| 7,299,964 B2 | 11/2007 | Jayaraman et al. |
| 7,310,236 B2 | 12/2007 | Takahashi et al. |
| 7,317,416 B2 | 1/2008 | Flom et al. |
| 7,348,285 B2 | 3/2008 | Dhawan et al. |
| 7,365,031 B2 | 4/2008 | Swallow et al. |
| 7,421,061 B2 | 9/2008 | Boese et al. |
| 7,462,035 B2 | 12/2008 | Lee et al. |
| 7,528,082 B2 | 5/2009 | Krans et al. |
| 7,544,627 B2 | 6/2009 | Tao et al. |
| 7,578,195 B2 | 8/2009 | DeAngelis et al. |
| 7,644,488 B2 | 1/2010 | Aisenbrey |
| 7,670,144 B2 | 3/2010 | Ito et al. |
| 7,677,729 B2 | 3/2010 | Vilser et al. |
| 7,691,067 B2 | 4/2010 | Westbrook et al. |
| 7,698,154 B2 | 4/2010 | Marchosky |
| 7,791,700 B2 | 9/2010 | Bellamy |
| 7,834,276 B2 | 11/2010 | Chou et al. |
| 7,952,512 B1 | 5/2011 | Delker et al. |
| 8,062,220 B2 | 11/2011 | Kurtz et al. |
| 8,169,404 B1 | 5/2012 | Boillot |
| 8,179,604 B1 | 5/2012 | Prada Gomez et al. |
| 8,282,232 B2 | 10/2012 | Hsu et al. |
| 8,289,185 B2 | 10/2012 | Alonso |
| 8,301,232 B2 | 10/2012 | Albert et al. |
| 8,334,226 B2 | 12/2012 | Nhan et al. |
| 8,341,762 B2 | 1/2013 | Balzano |
| 8,367,942 B2 | 2/2013 | Howell et al. |
| 8,475,367 B1 | 7/2013 | Yuen et al. |
| 8,505,474 B2 | 8/2013 | Kang et al. |
| 8,549,829 B2 | 10/2013 | Song et al. |
| 8,560,972 B2 | 10/2013 | Wilson |
| 8,569,189 B2 | 10/2013 | Bhattacharya et al. |
| 8,614,689 B2 | 12/2013 | Nishikawa et al. |
| 8,700,137 B2 | 4/2014 | Albert |
| 8,758,020 B2 | 6/2014 | Burdea et al. |
| 8,759,713 B2 | 6/2014 | Sheats |
| 8,764,651 B2 | 7/2014 | Tran |
| 8,785,778 B2 | 7/2014 | Streeter et al. |
| 8,790,257 B2 | 7/2014 | Libbus et al. |
| 8,814,574 B2 | 8/2014 | Selby et al. |
| 9,055,879 B2 | 6/2015 | Selby et al. |
| 9,093,289 B2 | 7/2015 | Vicard et al. |
| 9,125,456 B2 | 9/2015 | Chow |
| 9,141,194 B1 | 9/2015 | Keyes et al. |
| 9,148,949 B2 | 9/2015 | Guofu et al. |
| 9,230,160 B1 | 1/2016 | Kanter |
| 9,331,422 B2 | 5/2016 | Nazzaro et al. |
| 9,335,825 B2 | 5/2016 | Rautiainen et al. |
| 9,575,560 B2 | 2/2017 | Poupyrev et al. |
| 9,588,625 B2 | 3/2017 | Poupyrev |
| 9,594,443 B2 | 3/2017 | Vanblon et al. |
| 9,600,080 B2 | 3/2017 | Poupyrev |
| 9,693,592 B2 | 7/2017 | Robinson et al. |
| 9,778,749 B2 | 10/2017 | Poupyrev |
| 9,811,164 B2 | 11/2017 | Poupyrev |
| 9,837,760 B2 | 12/2017 | Karagozler et al. |
| 9,921,660 B2 | 3/2018 | Poupyrev |
| 9,933,908 B2 | 4/2018 | Poupyrev |
| 2002/0080156 A1 | 6/2002 | Abbott et al. |
| 2002/0170897 A1 | 11/2002 | Hall |
| 2003/0100228 A1 | 5/2003 | Bungo et al. |
| 2003/0119391 A1 | 6/2003 | Swallow et al. |
| 2004/0009729 A1 | 1/2004 | Hill et al. |
| 2004/0259391 A1 | 12/2004 | Jung et al. |
| 2005/0069695 A1 | 3/2005 | Jung et al. |
| 2005/0128124 A1 | 6/2005 | Greneker et al. |
| 2005/0148876 A1 | 7/2005 | Endoh et al. |
| 2006/0035554 A1 | 2/2006 | Glaser et al. |
| 2006/0040739 A1 | 2/2006 | Wells |
| 2006/0157734 A1 | 7/2006 | Onodero et al. |
| 2006/0166620 A1 | 7/2006 | Sorensen |
| 2006/0258205 A1 | 11/2006 | Locher et al. |
| 2007/0026695 A1 | 2/2007 | Lee et al. |
| 2007/0118043 A1 | 5/2007 | Oliver et al. |
| 2007/0161921 A1 | 7/2007 | Rausch |
| 2007/0176821 A1 | 8/2007 | Flom et al. |
| 2007/0192647 A1 | 8/2007 | Glaser |
| 2007/0197115 A1 | 8/2007 | Eves et al. |
| 2007/0197878 A1 | 8/2007 | Shklarski |
| 2007/0210074 A1 | 9/2007 | Maurer et al. |
| 2008/0002027 A1 | 1/2008 | Kondo et al. |
| 2008/0024438 A1 | 1/2008 | Collins et al. |
| 2008/0065291 A1 | 3/2008 | Breed |
| 2008/0134102 A1 | 6/2008 | Movold et al. |
| 2008/0136775 A1 | 6/2008 | Conant |
| 2008/0168396 A1 | 7/2008 | Matas et al. |
| 2008/0211766 A1 | 9/2008 | Westerman et al. |
| 2008/0233822 A1 | 9/2008 | Swallow et al. |
| 2008/0282665 A1 | 11/2008 | Speleers |
| 2008/0291158 A1 | 11/2008 | Park et al. |
| 2008/0303800 A1 | 12/2008 | Elwell |
| 2008/0316085 A1 | 12/2008 | Rofougaran et al. |
| 2008/0320419 A1 | 12/2008 | Matas et al. |
| 2009/0033585 A1 | 2/2009 | Lang |
| 2009/0053950 A1 | 2/2009 | Surve |
| 2009/0056300 A1 | 3/2009 | Chung et al. |
| 2009/0113298 A1 | 4/2009 | Jung et al. |
| 2009/0115617 A1 | 5/2009 | Sano et al. |
| 2009/0118648 A1 | 5/2009 | Kandori et al. |
| 2009/0149036 A1 | 6/2009 | Lee et al. |
| 2009/0177068 A1 | 7/2009 | Stivoric et al. |
| 2009/0203244 A1 | 8/2009 | Toonder |
| 2009/0270690 A1 | 10/2009 | Roos et al. |
| 2009/0288762 A1 | 11/2009 | Wolfel |
| 2009/0295712 A1 | 12/2009 | Ritzau |
| 2010/0065320 A1 | 3/2010 | Urano |
| 2010/0071205 A1 | 3/2010 | Graumann et al. |
| 2010/0094141 A1 | 4/2010 | Puswella |
| 2010/0201586 A1 | 8/2010 | Michalk |

(56) References Cited

U.S. PATENT DOCUMENTS

| | | |
|---|---|---|
| 2010/0205667 A1 | 8/2010 | Anderson et al. |
| 2010/0208035 A1 | 8/2010 | Pinault et al. |
| 2010/0225562 A1 | 9/2010 | Smith |
| 2010/0241009 A1 | 9/2010 | Petkie |
| 2010/0281438 A1 | 11/2010 | Latta et al. |
| 2010/0306713 A1 | 12/2010 | Geisner et al. |
| 2010/0313414 A1 | 12/2010 | Sheats |
| 2010/0325770 A1 | 12/2010 | Chung et al. |
| 2011/0003664 A1 | 1/2011 | Richard |
| 2011/0010014 A1 | 1/2011 | Oexman et al. |
| 2011/0073353 A1 | 3/2011 | Lee et al. |
| 2011/0093820 A1 | 4/2011 | Zhang et al. |
| 2011/0166940 A1 | 7/2011 | Bangera et al. |
| 2011/0181509 A1 | 7/2011 | Rautiainen et al. |
| 2011/0181510 A1 | 7/2011 | Hakala et al. |
| 2011/0197263 A1 | 8/2011 | Stinson, III |
| 2011/0213218 A1 | 9/2011 | Weiner et al. |
| 2011/0221666 A1 | 9/2011 | Newton et al. |
| 2011/0234492 A1 | 9/2011 | Ajmera et al. |
| 2011/0279303 A1 | 11/2011 | Smith |
| 2011/0303341 A1 | 12/2011 | Meiss et al. |
| 2011/0307842 A1 | 12/2011 | Chiang et al. |
| 2011/0318985 A1 | 12/2011 | McDermid |
| 2012/0001875 A1 | 1/2012 | Li et al. |
| 2012/0019168 A1 | 1/2012 | Noda et al. |
| 2012/0047468 A1 | 2/2012 | Santos et al. |
| 2012/0068876 A1 | 3/2012 | Bangera et al. |
| 2012/0092284 A1 | 4/2012 | Rofougaran et al. |
| 2012/0123232 A1 | 5/2012 | Najarian et al. |
| 2012/0127082 A1 | 5/2012 | Kushler et al. |
| 2012/0144934 A1 | 6/2012 | Russell et al. |
| 2012/0150493 A1 | 6/2012 | Casey et al. |
| 2012/0156926 A1 | 6/2012 | Kato et al. |
| 2012/0174299 A1 | 7/2012 | Balzano |
| 2012/0174736 A1 | 7/2012 | Wang et al. |
| 2012/0193801 A1 | 8/2012 | Gross et al. |
| 2012/0248093 A1 | 10/2012 | Ulrich et al. |
| 2012/0254810 A1 | 10/2012 | Heck et al. |
| 2012/0268416 A1 | 10/2012 | Pirogov et al. |
| 2012/0280900 A1 | 11/2012 | Wang et al. |
| 2012/0310665 A1 | 12/2012 | Xu et al. |
| 2013/0016070 A1 | 1/2013 | Starner et al. |
| 2013/0046544 A1 | 2/2013 | Kay et al. |
| 2013/0053653 A1 | 2/2013 | Cuddihy et al. |
| 2013/0082922 A1 | 4/2013 | Miller |
| 2013/0083173 A1 | 4/2013 | Geisner et al. |
| 2013/0102217 A1 | 4/2013 | Jeon |
| 2013/0104084 A1 | 4/2013 | Mlyniec et al. |
| 2013/0132931 A1 | 5/2013 | Bruns et al. |
| 2013/0147833 A1 | 6/2013 | Aubauer et al. |
| 2013/0150735 A1 | 6/2013 | Cheng |
| 2013/0161078 A1 | 6/2013 | Li |
| 2013/0194173 A1 | 8/2013 | Zhu et al. |
| 2013/0195330 A1 | 8/2013 | Kim et al. |
| 2013/0196716 A1 | 8/2013 | Khurram |
| 2013/0207962 A1 | 8/2013 | Oberdorfer et al. |
| 2013/0260630 A1* | 10/2013 | Ito ............................. D03D 1/00 442/205 |
| 2013/0278499 A1 | 10/2013 | Anderson |
| 2013/0278501 A1 | 10/2013 | Bulzacki |
| 2013/0332438 A1 | 12/2013 | Li et al. |
| 2013/0345569 A1 | 12/2013 | Mestha et al. |
| 2014/0005809 A1 | 1/2014 | Frei et al. |
| 2014/0049487 A1 | 2/2014 | Konertz et al. |
| 2014/0070957 A1* | 3/2014 | Longinotti-Buitoni ............................. A61B 5/02055 340/870.01 |
| 2014/0073969 A1 | 3/2014 | Zou et al. |
| 2014/0081100 A1 | 3/2014 | Muhsin et al. |
| 2014/0095480 A1 | 4/2014 | Marantz et al. |
| 2014/0121540 A1 | 5/2014 | Raskin |
| 2014/0135631 A1 | 5/2014 | Brumback et al. |
| 2014/0139422 A1 | 5/2014 | Mistry et al. |
| 2014/0139616 A1 | 5/2014 | Pinter et al. |
| 2014/0143678 A1 | 5/2014 | Mistry et al. |
| 2014/0184496 A1 | 7/2014 | Gribetz et al. |
| 2014/0191939 A1 | 7/2014 | Penn et al. |
| 2014/0200416 A1 | 7/2014 | Kashef et al. |
| 2014/0201690 A1 | 7/2014 | Holz |
| 2014/0208275 A1 | 7/2014 | Mongia et al. |
| 2014/0215389 A1 | 7/2014 | Walsh et al. |
| 2014/0239065 A1 | 8/2014 | Zhou et al. |
| 2014/0244277 A1 | 8/2014 | Krishna Rao et al. |
| 2014/0246415 A1 | 9/2014 | Wittkowski |
| 2014/0247212 A1 | 9/2014 | Kim et al. |
| 2014/0250515 A1 | 9/2014 | Jakobsson |
| 2014/0253431 A1 | 9/2014 | Gossweiler et al. |
| 2014/0253709 A1 | 9/2014 | Bresch et al. |
| 2014/0262478 A1 | 9/2014 | Harris et al. |
| 2014/0280295 A1 | 9/2014 | Kurochikin et al. |
| 2014/0281975 A1 | 9/2014 | Anderson |
| 2014/0297006 A1 | 10/2014 | Sadhu |
| 2014/0306936 A1 | 10/2014 | Dahl et al. |
| 2014/0316261 A1 | 10/2014 | Lux et al. |
| 2014/0318699 A1* | 10/2014 | Longinotti-Buitoni ............................. A61B 5/0002 156/247 |
| 2014/0324888 A1 | 10/2014 | Xie et al. |
| 2014/0343392 A1 | 11/2014 | Yang |
| 2014/0347295 A1 | 11/2014 | Kim et al. |
| 2014/0357369 A1 | 12/2014 | Callens et al. |
| 2015/0002391 A1 | 1/2015 | Chen |
| 2015/0009096 A1 | 1/2015 | Lee et al. |
| 2015/0029050 A1 | 1/2015 | Driscoll et al. |
| 2015/0030256 A1 | 1/2015 | Brady et al. |
| 2015/0040040 A1 | 2/2015 | Balan et al. |
| 2015/0068069 A1 | 3/2015 | Tran et al. |
| 2015/0077282 A1 | 3/2015 | Mohamadi |
| 2015/0085060 A1 | 3/2015 | Fish et al. |
| 2015/0091858 A1 | 4/2015 | Rosenberg et al. |
| 2015/0091859 A1 | 4/2015 | Rosenberg et al. |
| 2015/0112606 A1 | 4/2015 | He et al. |
| 2015/0133017 A1 | 5/2015 | Liao et al. |
| 2015/0143601 A1 | 5/2015 | Longinotti-Buitoni et al. |
| 2015/0145805 A1 | 5/2015 | Liu |
| 2015/0162729 A1 | 6/2015 | Reversat et al. |
| 2015/0177866 A1 | 6/2015 | Hwang et al. |
| 2015/0199045 A1 | 7/2015 | Robucci et al. |
| 2015/0256763 A1 | 9/2015 | Niemi |
| 2015/0261320 A1 | 9/2015 | Leto |
| 2015/0268027 A1 | 9/2015 | Gerdes |
| 2015/0268799 A1 | 9/2015 | Starner et al. |
| 2015/0277569 A1 | 10/2015 | Sprenger et al. |
| 2015/0280102 A1 | 10/2015 | Tajitsu et al. |
| 2015/0312041 A1 | 10/2015 | Choi |
| 2015/0323993 A1 | 11/2015 | Levesque et al. |
| 2015/0332075 A1 | 11/2015 | Burch |
| 2015/0346820 A1 | 12/2015 | Poupyrev et al. |
| 2015/0375339 A1 | 12/2015 | Sterling et al. |
| 2016/0018948 A1 | 1/2016 | Parvarandeh et al. |
| 2016/0026253 A1 | 1/2016 | Bradski et al. |
| 2016/0038083 A1 | 2/2016 | Ding et al. |
| 2016/0041617 A1 | 2/2016 | Poupyrev |
| 2016/0041618 A1 | 2/2016 | Poupyrev |
| 2016/0048235 A1 | 2/2016 | Poupyrev |
| 2016/0048236 A1 | 2/2016 | Poupyrev |
| 2016/0054792 A1 | 2/2016 | Poupyrev |
| 2016/0054803 A1 | 2/2016 | Poupyrev |
| 2016/0054804 A1 | 2/2016 | Gollakata et al. |
| 2016/0055201 A1 | 2/2016 | Poupyrev et al. |
| 2016/0098089 A1 | 4/2016 | Poupyrev |
| 2016/0100166 A1 | 4/2016 | Dragne et al. |
| 2016/0103500 A1 | 4/2016 | Hussey et al. |
| 2016/0106328 A1 | 4/2016 | Mestha et al. |
| 2016/0145776 A1 | 5/2016 | Roh |
| 2016/0186366 A1 | 6/2016 | McMaster |
| 2016/0216825 A1 | 7/2016 | Forutanpour |
| 2016/0249698 A1 | 9/2016 | Berzowska et al. |
| 2016/0253044 A1 | 9/2016 | Katz |
| 2016/0259037 A1 | 9/2016 | Molchanov et al. |
| 2016/0283101 A1 | 9/2016 | Schwesig et al. |
| 2016/0284436 A1 | 9/2016 | Fukuhara et al. |
| 2016/0299526 A1 | 10/2016 | Inagaki et al. |
| 2016/0320852 A1 | 11/2016 | Poupyrev |

(56) References Cited

U.S. PATENT DOCUMENTS

| | | |
|---|---|---|
| 2016/0320853 A1 | 11/2016 | Lien et al. |
| 2016/0320854 A1 | 11/2016 | Lien et al. |
| 2016/0345638 A1 | 12/2016 | Robinson et al. |
| 2016/0349790 A1 | 12/2016 | Connor |
| 2016/0349845 A1 | 12/2016 | Poupyrev et al. |
| 2017/0052618 A1 | 2/2017 | Lee et al. |
| 2017/0060298 A1 | 3/2017 | Hwang et al. |
| 2017/0075496 A1 | 3/2017 | Rosenberg et al. |
| 2017/0097413 A1 | 4/2017 | Gillian et al. |
| 2017/0097684 A1 | 4/2017 | Lien |
| 2017/0115777 A1 | 4/2017 | Poupyrev |
| 2017/0125940 A1 | 5/2017 | Karagozler et al. |
| 2017/0196513 A1 | 7/2017 | Longinotti-Buitoni et al. |
| 2017/0232538 A1 | 8/2017 | Robinson et al. |
| 2017/0249033 A1 | 8/2017 | Podhajny et al. |
| 2017/0322633 A1 | 11/2017 | Shen et al. |
| 2017/0325337 A1 | 11/2017 | Karagozler et al. |
| 2017/0325518 A1 | 11/2017 | Poupyrev et al. |
| 2017/0329425 A1 | 11/2017 | Karagozler et al. |
| 2018/0004301 A1 | 1/2018 | Poupyrev |
| 2018/0046258 A1 | 2/2018 | Poupyrev |

FOREIGN PATENT DOCUMENTS

| | | |
|---|---|---|
| DE | 102011075725 | 11/2012 |
| DE | 102013201359 | 7/2014 |
| EP | 0161895 | 11/1985 |
| EP | 1815788 | 8/2007 |
| GB | 2070469 | 9/1981 |
| GB | 2443208 | 4/2008 |
| JP | 2003280049 | 10/2003 |
| JP | 2006234716 | 9/2006 |
| JP | 2011102457 | 5/2011 |
| WO | WO-0130123 | 4/2001 |
| WO | WO-2001027855 | 4/2001 |
| WO | WO-0175778 | 10/2001 |
| WO | WO-2002082999 | 10/2002 |
| WO | WO-2005033387 | 4/2005 |
| WO | 2007125298 | 11/2007 |
| WO | WO-2008061385 | 5/2008 |
| WO | WO-2009032073 | 3/2009 |
| WO | 2009083467 | 7/2009 |
| WO | WO-2010032173 | 3/2010 |
| WO | WO-2012026013 | 3/2012 |
| WO | WO-2012152476 | 11/2012 |
| WO | WO-2013082806 | 6/2013 |
| WO | WO-2013084108 | 6/2013 |
| WO | WO-2013186696 | 12/2013 |
| WO | WO-2013191657 | 12/2013 |
| WO | WO-2014019085 | 2/2014 |
| WO | WO-2014116968 | 7/2014 |
| WO | WO-2014136027 | 9/2014 |
| WO | WO-2014138280 | 9/2014 |
| WO | WO-2014160893 | 10/2014 |
| WO | WO-2014165476 | 10/2014 |
| WO | WO-2014204323 | 12/2014 |
| WO | WO-2015017931 | 2/2015 |
| WO | WO-2015022671 | 2/2015 |
| WO | 2016053624 | 4/2016 |
| WO | 2016154560 | 9/2016 |
| WO | 2016154568 | 9/2016 |
| WO | 20170200949 | 11/2017 |

OTHER PUBLICATIONS

"Cardiio", Retrieved From: <http://www.cardiio.com/> Apr. 15, 2015 App Information Retrieved From: <https://itunes.apple.com/us/app/cardiio-touchless-camera-pulse/id542891434?ls=1&mt=8> Apr. 15, 2015, Feb. 24, 2015, 6 pages.

"Extended European Search Report", EP Application No. 15170577.9, dated Nov. 5, 2015, 12 pages.

"Final Office Action", U.S. Appl. No. 14/312,486, dated Jun. 3, 2016, 32 pages.

"Final Office Action", U.S. Appl. No. 14/504,038, dated Sep. 27, 2016, 23 pages.

"International Search Report and Written Opinion", Application No. PCT/US2016/032307, dated Aug. 25, 2016, 13 pages.

"International Search Report and Written Opinion", Application No. PCT/US2016/029820, dated Jul. 15, 2016, 14 pages.

"International Search Report and Written Opinion", Application No. PCT/US2016/030177, dated Aug. 2, 2016, 15 pages.

"International Search Report and Written Opinion", Application No. PCT/US2015/043963, dated Nov. 24, 2015, 16 pages.

"International Search Report and Written Opinion", Application No. PCT/US2015/050903, dated Feb. 19, 2016, 18 pages.

"International Search Report and Written Opinion", Application No. PCT/US2016/030115, dated Aug. 8, 2016, 18 pages.

"International Search Report and Written Opinion", Application No. PCT/US2015/043949, dated Dec. 1, 2015, 18 pages.

"Non-Final Office Action", U.S. Appl. No. 14/312,486, dated Oct. 23, 2015, 25 pages.

"Non-Final Office Action", U.S. Appl. No. 14/504,038, dated Feb. 26, 2016, 22 pages.

"Non-Final Office Action", U.S. Appl. No. 14/582,896, dated Jun. 29, 2016, 9 pages.

"Non-Final Office Action", U.S. Appl. No. 14/666,155, dated Aug. 24, 2016, 9 pages.

"Non-Final Office Action", U.S. Appl. No. 14/681,625, dated Aug. 12, 2016, 9 pages.

"Non-Final Office Action", U.S. Appl. No. 14/930,220, dated Sep. 14, 2016, 15 pages.

"Notice of Allowance", U.S. Appl. No. 14/504,061, dated Sep. 12, 2016, 7 pages.

"Philips Vital Signs Camera", Retrieved From: <http://www.vitalsignscamera.com/> Apr. 15, 2015, Jul. 17, 2013, 2 pages.

"Restriction Requirement", U.S. Appl. No. 14/666,155, dated Jul. 22, 2016, 5 pages.

"The Instant Blood Pressure app estimates blood pressure with your smartphone and our algorithm", Retrieved at: http://www.instantbloodpressure.com/—on Jun. 23, 2016, 6 pages.

Arbabian,"A 94GHz mm-Wave to Baseband Pulsed-Radar for Imaging and Gesture Recognition", 2012 IEEE, 2012 Symposium on VLSI Circuits Digest of Technical Papers, 2012, 2 pages.

Balakrishnan,"Detecting Pulse from Head Motions in Video", In Proceedings: CVPR '13 Proceedings of the 2013 IEEE Conference on Computer Vision and Pattern Recognition Available at: <http://people.csail.mit.edu/mrub/vidmag/papers/Balakrishnan_Detecting_Pulse_from_2013_CVPR_paper.pdf>, Jun. 23, 2013, 8 pages.

Couderc,"Detection of Atrial Fibrillation using Contactless Facial Video Monitoring", In Proceedings: Heart Rhythm Society, vol. 12, Issue 1 Available at: <http://www.heartrhythmjournal.com/article/S1547-5271(14)00924-2/pdf>, Jan. 2015, 7 pages.

Espina,"Wireless Body Sensor Network for Continuous Cuff-less Blood Pressure Monitoring", International Summer School on Medical Devices and Biosensors, 2006, Sep. 2006, 5 pages.

Godana,"Human Movement Characterization in Indoor Environment using GNU Radio Based Radar", Retrieved at: http://repository.tudelft.nl/islandora/object/uuid:414e1868-dd00-4113-9989-4c213f1f7094?collection=education, Nov. 30, 2009, 100 pages.

He,"A Continuous, Wearable, and Wireless Heart Monitor Using Head Ballistocardiogram (BCG) and Head Electrocardiogram (ECG) with a Nanowatt ECG Heartbeat Detection Circuit", In Proceedings: Thesis, Department of Electrical Engineering and Computer Science, Massachusetts Institute of Technology Available at: <http://dspace.mit.edu/handle/1721.1/79221>, Feb. 2013, 137 pages.

Nakajima,"Development of Real-Time Image Sequence Analysis for Evaluating Posture Change and Respiratory Rate of a Subject in Bed", In Proceedings: Physiological Measurement, vol. 22, No. 3 Retrieved From: <http://iopscience.iop.org/0967-3334/22/3/401/pdf/0967-3334_22_3_401.pdf> Feb. 27, 2015, Aug. 2001, 8 pages.

Poh,"A Medical Mirror for Non-contact Health Monitoring", In Proceedings: ACM SIGGRAPH Emerging Technologies Available at: <http://affect.media.mit.edu/pdfs/11.Poh-etal-SIGGRAPH.pdf>, 2011, 1 page.

(56) References Cited

OTHER PUBLICATIONS

Poh,"Non-contact, Automated Cardiac Pulse Measurements Using Video Imaging and Blind Source Separation.", In Proceedings: Optics Express, vol. 18, No. 10 Available at: <http://www.opticsinfobase.org/view_article.cfm?gotourl=http%3A%2F%2Fwww%2Eopticsinfobase%2Eorg%2FDirectPDFAccess%2F77B04D55%2DBC95%2D6937%2D5BAC49A426378C02%5F199381%2Foe%2D18%2D10%2D10762%2Ep, May 7, 2010, 13 pages.
Pu,"Whole-Home Gesture Recognition Using Wireless Signals", MobiCom '13 Proceedings of the 19th annual international conference on Mobile computing & networking, Aug. 27, 2013, 12 pages.
Wang,"Exploiting Spatial Redundancy of Image Sensor for Motion Robust rPPG", In Proceedings: IEEE Transactions on Biomedical Engineering, vol. 62, Issue 2, Jan. 19, 2015, 11 pages.
Wang,"Micro-Doppler Signatures for Intelligent Human Gait Recognition Using a UWB Impulse Radar", 2011 IEEE International Symposium on Antennas and Propagation (APSURSI), Jul. 3, 2011, pp. 2103-2106.
Zhadobov,"Millimeter-wave Interactions with the Human Body: State of Knowledge and Recent Advances", International Journal of Microwave and Wireless Technologies, Mar. 1, 2011, 11 pages.
"International Search Report and Written Opinion", Application No. PCT/US2016/024267, dated Jun. 20, 2016, 13 pages.
"International Search Report and Written Opinion", Application No. PCT/US2016/024273, dated Jun. 20, 2016, 13 pages.
Patel,"Applications of Electrically Conductive Yarns in Technical Textiles", International Conference on Power System Technology (POWECON), Oct. 30, 2012, 6 pages.
Zhang,"Study of the Structural Design and Capacitance Characteristics of Fabric Sensor", Advanced Materials Research (vols. 194-196), Feb. 21, 2011, 8 pages.
"Corrected Notice of Allowance", U.S. Appl. No. 14/312,486, dated Oct. 28, 2016, 4 pages.
"International Search Report and Written Opinion", Application No. PCT/US2016/034366, dated Nov. 7, 2016, 13 pages.
"Non-Final Office Action", U.S. Appl. No. 14/518,863, dated Oct. 14, 2016, 16 pages.
"Notice of Allowance", U.S. Appl. No. 14/312,486, dated Oct. 7, 2016, 15 pages.
"Notice of Allowance", U.S. Appl. No. 14/582,896, dated Nov. 7, 2016, 5 pages.
"Pre-Interview Communication", U.S. Appl. No. 14/513,875, dated Oct. 21, 2016, 3 pages.
Pu,"Gesture Recognition Using Wireless Signals", Oct. 2014, pp. 15-18.
"Corrected Notice of Allowance", U.S. Appl. No. 14/504,061, dated Dec. 27, 2016, 2 pages.
"Corrected Notice of Allowance", U.S. Appl. No. 14/582,896, dated Dec. 19, 2016, 2 pages.
"International Search Report and Written Opinion", Application No. PCT/US2016/024289, dated Aug. 25, 2016, 17 pages.
Cheng,"Smart Textiles: From Niche to Mainstream", IEEE Pervasive Computing, Jul. 2013, pp. 81-84.
Farringdon,"Wearable Sensor Badge & Sensor Jacket for Context Awareness", Third International Symposium on Wearable Computers, Oct. 1999, 7 pages.
Schneegass,"Towards a Garment OS: Supporting Application Development for Smart Garments", Wearable Computers, ACM, Sep. 2014, 6 pages.
"Frogpad Introduces Wearable Fabric Keyboard with Bluetooth Technology", Retrieved From: <http://www.geekzone.co.nz/content.asp?contentid=3898> Mar. 16, 2015, Jan. 7, 2005, 2 pages.
"International Search Report and Written Opinion", Application No. PCT/US2015/044774, dated Nov. 3, 2015, 12 pages.
"Non-Final Office Action", U.S. Appl. No. 14/504,061, dated Nov. 4, 2015, 8 pages.
Holleis,"Evaluating Capacitive Touch Input on Clothes", Proceedings of the 10th International Conference on Human Computer Interaction, Jan. 1, 2008, 10 pages.
Wijesiriwardana,"Capacitive Fibre-Meshed Transducer for Touch & Proximity Sensing Applications", IEEE Sensors Journal, IEEE Service Center, Oct. 1, 2005, 5 pages.
"Corrected Notice of Allowance", U.S. Appl. No. 14/312,486, dated Jan. 23, 2017, 4 pages.
"Corrected Notice of Allowance", U.S. Appl. No. 14/582,896, dated Feb. 6, 2017, 2 pages.
"Corrected Notice of Allowance", U.S. Appl. No. 14/582,896, dated Feb. 23, 2017, 2 pages.
"International Preliminary Report on Patentability", Application No. PCT/US2015/043963, dated Feb. 16, 2017, 12 pages.
"International Preliminary Report on Patentability", Application No. PCT/US2015/030388, dated Dec. 15, 2016, 12 pages.
"International Preliminary Report on Patentability", Application No. PCT/US2015/043949, dated Feb. 16, 2017, 13 pages.
"International Preliminary Report on Patentability", Application No. PCT/US2015/044774, dated Mar. 2, 2017, 8 pages.
"International Search Report and Written Opinion", Application No. PCT/US2016/062082, dated Feb. 23, 2017, 12 pages.
"International Search Report and Written Opinion", Application No. PCT/US2016/055671, dated Dec. 1, 2016, 14 pages.
"Non-Final Office Action", U.S. Appl. No. 14/504,121, dated Jan. 9, 2017, 13 pages.
"Non-Final Office Action", U.S. Appl. No. 14/504,139, dated Jan. 27, 2017, 10 pages.
"Non-Final Office Action", U.S. Appl. No. 14/513,875, dated Feb. 21, 2017, 9 pages.
"Non-Final Office Action", U.S. Appl. No. 14/874,955, dated Feb. 27, 2017, 8 pages.
"Non-Final Office Action", U.S. Appl. No. 14/959,799, dated Jan. 27, 2017, 10 pages.
"Notice of Allowance", U.S. Appl. No. 14/930,220, dated Feb. 2, 2017, 8 pages.
"Pre-Interview Communication", U.S. Appl. No. 14/494,863, dated Jan. 27, 2017, 5 pages.
"Pre-Interview Communication", U.S. Appl. No. 14/959,901, dated Feb. 10, 2017, 3 pages.
"Combined Search and Examination Report", GB Application No. 1620892.8, dated Apr. 6, 2017, 5 pages.
"Corrected Notice of Allowance", U.S. Appl. No. 14/930,220, dated Mar. 20, 2017, 2 pages.
"First Action Interview Office Action", U.S. Appl. No. 14/959,901, dated Apr. 14, 2017, 3 pages.
"International Search Report and Written Opinion", Application No. PCT/US2016/060399, dated Jan. 30, 2017, 11 pages.
"Non-Final Office Action", U.S. Appl. No. 14/504,038, dated Mar. 22, 2017, 33 pages.
"Non-Final Office Action", U.S. Appl. No. 15/398,147, dated Mar. 9, 2017, 10 pages.
"Pre-Interview Communication", U.S. Appl. No. 15/343,067, dated Apr. 19, 2017, 3 pages.
"Textile Wire Brochure", Retrieved at: http://www.textile-wire.ch/en/home.html, Aug. 7, 2004, 17 pages.
Stoppa,"Wearable Electronics and Smart Textiles: A Critical Review", In Proceedings of Sensors, vol. 14, Issue 7, Jul. 7, 2014, pp. 11957-11992.
"Advisory Action", U.S. Appl. No. 14/504,139, dated Aug. 28, 2017, 3 pages.
"Combined Search and Examination Report", GB Application No. 1620891.0, dated May 31, 2017, 9 pages.
"Corrected Notice of Allowance", U.S. Appl. No. 14/930,220, dated May 11, 2017, 2 pages.
"Final Office Action", U.S. Appl. No. 15/398,147, dated Jun. 30, 2017, 11 pages.
"Final Office Action", U.S. Appl. No. 14/874,955, dated Jun. 30, 2017, 9 pages.
"Final Office Action", U.S. Appl. No. 14/959,799, dated Jul. 19, 2017, 12 pages.
"Final Office Action", U.S. Appl. No. 14/504,121, dated Aug. 8, 2017, 16 pages.
"Final Office Action", U.S. Appl. No. 14/959,901, dated Aug. 25, 2017, 19 pages.

(56) References Cited

OTHER PUBLICATIONS

"Final Office Action", U.S. Appl. No. 14/518,863, dated May 5, 2017, 18 pages.
"International Preliminary Report on Patentability", Application No. PCT/US2015/050903, dated Apr. 13, 2017, 12 pages.
"International Search Report and Written Opinion", Application No. PCT/US2016/063874, dated May 11, 2017, 19 pages.
"Non-Final Office Action", U.S. Appl. No. 14/862,409, dated Jun. 22, 2017, 15 pages.
"Non-Final Office Action", U.S. Appl. No. 15/093,533, dated Aug. 24, 2017, 18 pages.
"Non-Final Office Action", U.S. Appl. No. 15/142,619, dated Aug. 25, 2017, 16 pages.
"Non-Final Office Action", U.S. Appl. No. 14/959,799, dated Sep. 8, 2017, 16 pages.
"Non-Final Office Action", U.S. Appl. No. 15/398,147, dated Sep. 8, 2017, 7 pages.
"Non-Final Office Action", U.S. Appl. No. 15/403,066, dated May 4, 2017, 31 pages.
"Notice of Allowance", U.S. Appl. No. 14/513,875, dated Jun. 28, 2017, 7 pages.
"Notice of Allowance", U.S. Appl. No. 15/343,067, dated Jul. 27, 2017, 9 pages.
"Notice of Allowance", U.S. Appl. No. 14/504,038, dated Aug. 7, 2017, 17 pages.
"Notice of Allowance", U.S. Appl. No. 14/494,863, dated May 30, 2017, 7 pages.
"Pre-Interview Office Action", U.S. Appl. No. 14/862,409, dated Sep. 15, 2017, 16 pages.
"Final Office Action", U.S. Appl. No. 15/403,066, dated Oct. 5, 2017, 31 pages.
"Non-Final Office Action", U.S. Appl. No. 14/518,863, dated Sep. 29, 2017, 20 pages.
"Non-Final Office Action", U.S. Appl. No. 15/142,689, dated Oct. 4, 2017, 18 pages.
"Non-Final Office Action", U.S. Appl. No. 14/504,139, dated Oct. 18, 2017, 12 pages.
"Notice of Allowance", U.S. Appl. No. 14/874,955, dated Oct. 20, 2017, 7 pages.
"Written Opinion", PCT Application No. PCT/US2017/032733, dated Jul. 26, 2017, 5 pages.
"Final Office Action", U.S. Appl. No. 14/959,799, dated Jan. 4, 2018, 17 pages.
"International Search Report and Written Opinion", PCT/US2017/047691, dated Nov. 16, 2017, 13 pages.
"International Search Report and Written Opinion", PCT Application No. PCT/US2017/051663, dated Nov. 29, 2017, 16 pages.
"Non-Final Office Action", U.S. Appl. No. 14/504,121, dated Jan. 2, 2018, 19 pages.
"Non-Final Office Action", U.S. Appl. No. 14/959,901, dated Jan. 8, 2018, 21 pages.
"Non-Final Office Action", U.S. Appl. No. 15/595,649, dated Oct. 31, 2017, 16 pages.
"Non-Final Office Action", U.S. Appl. No. 14/862,409, dated Dec. 14, 2017, 17 pages.
"Notice of Allowance", U.S. Appl. No. 15/403,066, dated Jan. 8, 2018, 18 pages.
"Notice of Allowance", U.S. Appl. No. 15/398,147, dated Nov. 15, 2017, 8 pages.
"Preliminary Report on Patentability", PCT Application No. PCT/US2016/034366, dated Dec. 7, 2017, 10 pages.
"Restriction Requirement", U.S. Appl. No. 15/362,359, dated Jan. 8, 2018, 5 pages.
Bondade, et al., "A linear-assisted DC-DC hybrid power converter for envelope tracking RF power amplifiers", 2014 IEEE Energy Conversion Congress and Exposition (ECCE), IEEE, Sep. 14, 2014, pp. 5769-5773, XP032680873, DOI: 10.1109/ECCE.2014.6954193, Sep. 14, 2014, 5 pages.
Fan, et al., "Wireless Hand Gesture Recognition Based on Continuous-Wave Doppler Radar Sensors", IEEE Transactions on Microwave Theory and Techniques, Plenum, USA, vol. 64, No. 11, Nov. 1, 2016 (Nov. 1, 2016), pp. 4012-4012, XP011633246, ISSN: 0018-9480, DOI: 10.1109/TMTT.2016.2610427, Nov. 1, 2016, 9 pages.
Lien, et al., "Soli: Ubiquitous Gesture Sensing with Millimeter Wave Radar", ACM Transactions on Graphics (TOG), ACM, Us, vol. 35, No. 4, Jul. 11, 2016 (Jul. 11, 2016), pp. 1-19, XP058275791, ISSN: 0730-0301, DOI: 10.1145/2897824.2925953, Jul. 11, 2016, 19 pages.
Martinez-Garcia, et al., "Four-quadrant linear-assisted DC/DC voltage regulator", Analog Integrated Circuits and Signal Processing, Springer New York LLC, US, vol. 88, No. 1, Apr. 23, 2016 (Apr. 23, 2016) , pp. 151-160, XP035898949, ISSN: 0925-1030, DOI: 10.1007/S10470-016-0747-8, Apr. 23, 2016, 10 pages.
Skolnik, "CW and Frequency-Modulated Radar", In: "Introduction to Radar Systems", Jan. 1, 1981 (Jan. 1, 1981), McGraw Hill, XP055047545, ISBN: 978-0-07-057909-5 pp. 68-100, p. 95-p. 97, Jan. 1, 1981, 18 pages.
Zheng, et al., "Doppler Bio-Signal Detection Based Time-Domain Hand Gesture Recognition", 2013 IEEE MTT-S International Microwave Workshop Series on RF and Wireless Technologies for Biomedical and Healthcare Applications (IMWS-BIO), IEEE, Dec. 9, 2013 (Dec. 9, 2013), p. 3, XP032574214, DOI: 10.1109/IMWS-BIO.2013.6756200, Dec. 9, 2013, 3 Pages.
"Final Office Action", U.S. Appl. No. 15/142,619, dated Feb. 8, 2018, 15 pages.
"Final Office Action", U.S. Appl. No. 15/093,533, dated Mar. 21, 2018, 19 pages.
"Final Office Action", U.S. Appl. No. 14/518,863, Apr. 5, 2018, 21 pages.
"First Action Interview Office Action", U.S. Appl. No. 15/286,152, dated Mar. 1, 2018, 5 pages.
"Foreign Office Action", Chinese Application No. 201721290290.3, dated Mar. 9, 2018, 2 pages.
"Non-Final Office Action", U.S. Appl. No. 15/267,181, dated Feb. 8, 2018, 29 pages.
"Non-Final Office Action", U.S. Appl. No. 14/874,955, dated Feb. 8, 2018, 7 pages.
"Non-Final Office Action", U.S. Appl. No. 15/287,253, dated Apr. 5, 2018, 17 pages.
"Pre-Interview Communication", U.S. Appl. No. 15/166,198, dated Mar. 8, 2018, 8 pages.
"Pre-Interview First Office Action", U.S. Appl. No. 15/286,152, dated Feb. 8, 2018, 4 pages.

\* cited by examiner

TWO-LAYER INTERACTIVE TEXTILES

PRIORITY APPLICATION

This application is a non-provisional of and claims priority under 35 U.S.C. § 119(e) to U.S. patent application Ser. No. 62/138,831 titled "Two-Layer Interactive Textiles," filed Mar. 26, 2015, the disclosure of which is incorporated by reference herein in its entirety.

BACKGROUND

Currently, producing touch sensors can be complicated and expensive, especially if the touch sensor is intended to be light, flexible, or adaptive to various different kinds of use. Conventional touch pads, for example, are generally non-flexible and relatively costly to produce and to integrate into objects.

SUMMARY

This document describes two-layer interactive textiles. An interactive textile includes a grid of conductive thread woven into the interactive textile to form a capacitive touch sensor that is configured to detect touch-input. The interactive textile can process the touch-input to generate touch data that is useable to initiate functionality at various remote devices that are wirelessly coupled to the interactive textile. For example, the interactive textile may aid users in controlling volume on a stereo, pausing a movie playing on a television, or selecting a webpage on a desktop computer. Due to the flexibility of textiles, the interactive textile may be easily integrated within flexible objects, such as clothing, handbags, fabric casings, hats, and so forth.

In one or more implementations, the interactive textile includes a top textile layer and a bottom textile layer. Conductive threads are woven into the top textile layer and the bottom textile layer. When the top textile layer is combined with the bottom textile layer, the conductive threads from each layer form a capacitive touch sensor that is configured to detect touch-input. The bottom textile layer is not visible and couples the capacitive touch sensor to electronic components, such as a controller, a wireless interface, an output device (e.g., an LED, a display, or speaker), and so forth.

In one or more implementations, the conductive thread of the interactive textile includes a conductive core that includes at least one conductive wire and a cover layer constructed from flexible threads that covers the conductive core. The conductive core may be formed by twisting one or more flexible threads (e.g., silk threads, polyester threads, or cotton threads) with the conductive wire, or by wrapping flexible threads around the conductive wire. In one or more implementations, the conductive core is formed by braiding the conductive wire with flexible threads (e.g., silk). The cover layer may be formed by wrapping or braiding flexible threads around the conductive core. In one or more implementations, the conductive thread is implemented with a "double-braided" structure in which the conductive core is formed by braiding flexible threads with a conductive wire, and then braiding flexible threads around the braided conductive core.

In one or more implementations, a gesture manager is implemented at a computing device that is wirelessly coupled to the interactive textile. The gesture manager enables the user to create gestures and assign the gestures to various functionalities of the computing device. The gesture manager can store mappings between the created gestures and the functionalities in a gesture library to enable the user to initiate a functionality, at a subsequent time, by inputting a gesture assigned to the functionality into the interactive textile.

In one or more implementations, the gesture manager is configured to select a functionality based on both a gesture to the interactive textile and a context of the computing device. The ability to recognize gestures based on context enables the user to invoke a variety of different functionalities using a subset of gestures. For example, for a first context, a first gesture may initiate a first functionality, whereas for a second context, the same first gesture may initiate a second functionality.

In one or more implementations, the interactive textile is coupled to one or more output devices (e.g., a light source, a speaker, or a display) that is integrated within the flexible object. The output device can be controlled to provide notifications initiated from the computing device and/or feedback to the user based on the user's interactions with the interactive textile.

This summary is provided to introduce simplified concepts concerning two-layer interactive textiles, which is further described below in the Detailed Description. This summary is not intended to identify essential features of the claimed subject matter, nor is it intended for use in determining the scope of the claimed subject matter.

BRIEF DESCRIPTION OF THE DRAWINGS

Embodiments of techniques and devices for two-layer interactive textiles are described with reference to the following drawings. The same numbers are used throughout the drawings to reference like features and components.

DETAILED DESCRIPTION

Overview

Figure 1:
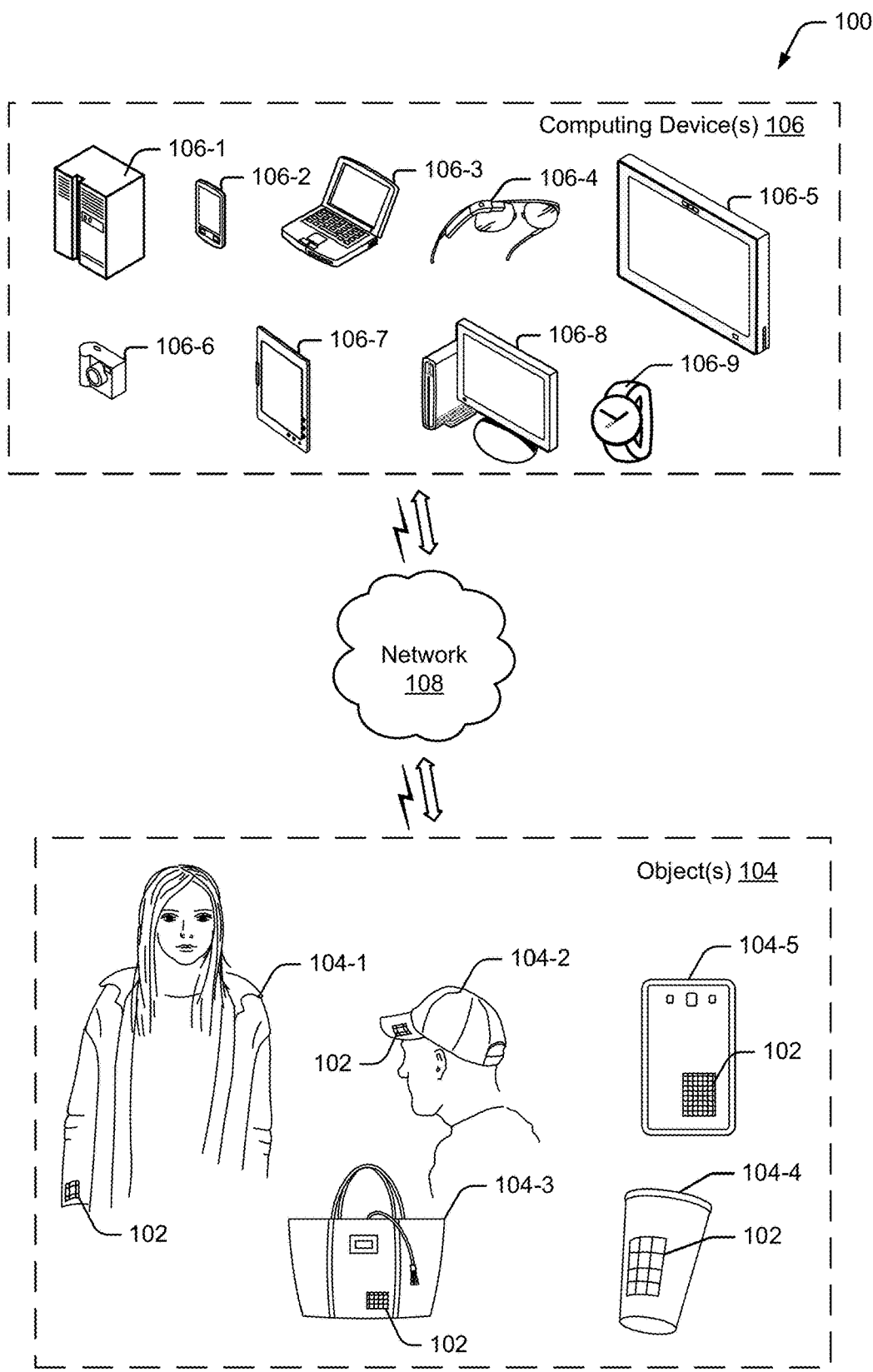
FIG. 1 is an illustration of an example environment in which techniques using, and an objects including, an interactive textile may be embodied.

Currently, producing touch sensors can be complicated and expensive, especially if the touch sensor is intended to be light, flexible, or adaptive to various different kinds of use. This document describes techniques using, and objects embodying, interactive textiles which are configured to sense multi-touch-input. To enable the interactive textiles to sense multi-touch-input, a grid of conductive thread is woven into the interactive textile to form a capacitive touch sensor that can detect touch-input. The interactive textile can process the touch-input to generate touch data that is useable to initiate functionality at various remote devices. For example, the interactive textiles may aid users in controlling volume on a stereo, pausing a movie playing on a television, or selecting a webpage on a desktop computer. Due to the flexibility of textiles, the interactive textile may be easily integrated within flexible objects, such as clothing, handbags, fabric casings, hats, and so forth.

In one or more implementations, the interactive textile includes a top textile layer and a bottom textile layer. Conductive threads are woven into the top textile layer and the bottom textile layer. When the top textile layer is combined with the bottom textile layer, the conductive threads from each layer form a capacitive touch sensor that is configured to detect touch-input. The bottom textile layer is not visible and couples the capacitive through sensor to electronic components, such as a controller, a wireless interface, an output device (e.g., an LED, a display, or speaker), and so forth.

In one or more implementations, the conductive thread of the interactive textile includes a conductive core that includes at least one conductive wire and a cover layer constructed from flexible threads that covers the conductive core. The conductive core may be formed by twisting one or more flexible threads (e.g., silk threads, polyester threads, or cotton threads) with the conductive wire, or by wrapping flexible threads around the conductive wire. In one or more implementations, the conductive core is formed by braiding the conductive wire with flexible threads (e.g., silk). The cover layer may be formed by wrapping or braiding flexible threads around the conductive core. In one or more implementations, the conductive thread is implemented with a "double-braided" structure in which the conductive core is formed by braiding flexible threads with a conductive wire, and then braiding flexible threads around the braided conductive core.

In one or more implementations, a gesture manager is implemented at a computing device that is wirelessly coupled to the interactive textile. The gesture manager enables the user to create gestures and assign the gestures to various functionalities of the computing device. The gesture manager can store mappings between the created gestures and the functionalities in a gesture library to enable the user to initiate a functionality, at a subsequent time, by inputting a gesture assigned to the functionality into the interactive textile.

In one or more implementations, the gesture manager is configured to select a functionality based on both a gesture to the interactive textile and a context of the computing device. The ability to recognize gestures based on context enables the user to invoke a variety of different functionalities using a subset of gestures. For example, for a first context, a first gesture may initiate a first functionality, whereas for a second context, the same first gesture may initiate a second functionality.

In one or more implementations, the interactive textile is coupled to one or more output devices (e.g., a light source, a speaker, or a display) that is integrated within the flexible object. The output device can be controlled to provide notifications initiated from the computing device and/or feedback to the user based on the user's interactions with the interactive textile.

Example Environment

FIG. 1 is an illustration of an example environment 100 in which techniques using, and objects including, an interactive textile may be embodied. Environment 100 includes an interactive textile 102, which is shown as being integrated within various objects 104. Interactive textile 102 is a textile that is configured to sense multi-touch input. As described herein, a textile corresponds to any type of flexible woven material consisting of a network of natural or artificial fibers, often referred to as thread or yarn. Textiles may be formed by weaving, knitting, crocheting, knotting, or pressing threads together.

In environment 100, objects 104 include "flexible" objects, such as a shirt 104-1, a hat 104-2, and a handbag 104-3. It is to be noted, however, that interactive textile 102 may be integrated within any type of flexible object made from fabric or a similar flexible material, such as articles of clothing, blankets, shower curtains, towels, sheets, bed spreads, or fabric casings of furniture, to name just a few. As discussed in more detail below, interactive textile 102 may be integrated within flexible objects 104 in a variety of different ways, including weaving, sewing, gluing, and so forth.

In this example, objects 104 further include "hard" objects, such as a plastic cup 104-4 and a hard smart phone casing 104-5. It is to be noted, however, that hard objects 104 may include any type of "hard" or "rigid" object made from non-flexible or semi-flexible materials, such as plastic, metal, aluminum, and so on. For example, hard objects 104 may also include plastic chairs, water bottles, plastic balls, or car parts, to name just a few. Interactive textile 102 may be integrated within hard objects 104 using a variety of different manufacturing processes. In one or more implementations, injection molding is used to integrate interactive textiles 102 into hard objects 104.

Interactive textile 102 enables a user to control object 104 that the interactive textile 102 is integrated with, or to control a variety of other computing devices 106 via a network 108. Computing devices 106 are illustrated with various non-limiting example devices: server 106-1, smart phone 106-2, laptop 106-3, computing spectacles 106-4, television 106-5, camera 106-6, tablet 106-7, desktop 106-8, and smart watch 106-9, though other devices may also be used, such as home automation and control systems, sound or entertainment systems, home appliances, security systems, netbooks, and e-readers. Note that computing device 106 can be wearable (e.g., computing spectacles and smart watches), non-wearable but mobile (e.g., laptops and tablets), or relatively immobile (e.g., desktops and servers).

Network 108 includes one or more of many types of wireless or partly wireless communication networks, such as a local-area-network (LAN), a wireless local-area-network (WLAN), a personal-area-network (PAN), a wide-area-network (WAN), an intranet, the Internet, a peer-to-peer network, point-to-point network, a mesh network, and so forth.

Interactive textile 102 can interact with computing devices 106 by transmitting touch data through network 108. Computing device 106 uses the touch data to control computing device 106 or applications at computing device 106. As an example, consider that interactive textile 102 integrated at shirt 104-1 may be configured to control the user's smart phone 106-2 in the user's pocket, television 106-5 in the user's home, smart watch 106-9 on the user's wrist, or various other appliances in the user's house, such as thermostats, lights, music, and so forth. For example, the user may be able to swipe up or down on interactive textile 102 integrated within the user's shirt 104-1 to cause the volume on television 106-5 to go up or down, to cause the temperature controlled by a thermostat in the user's house to increase or decrease, or to turn on and off lights in the user's house. Note that any type of touch, tap, swipe, hold, or stroke gesture may be recognized by interactive textile 102.

Figure 2:
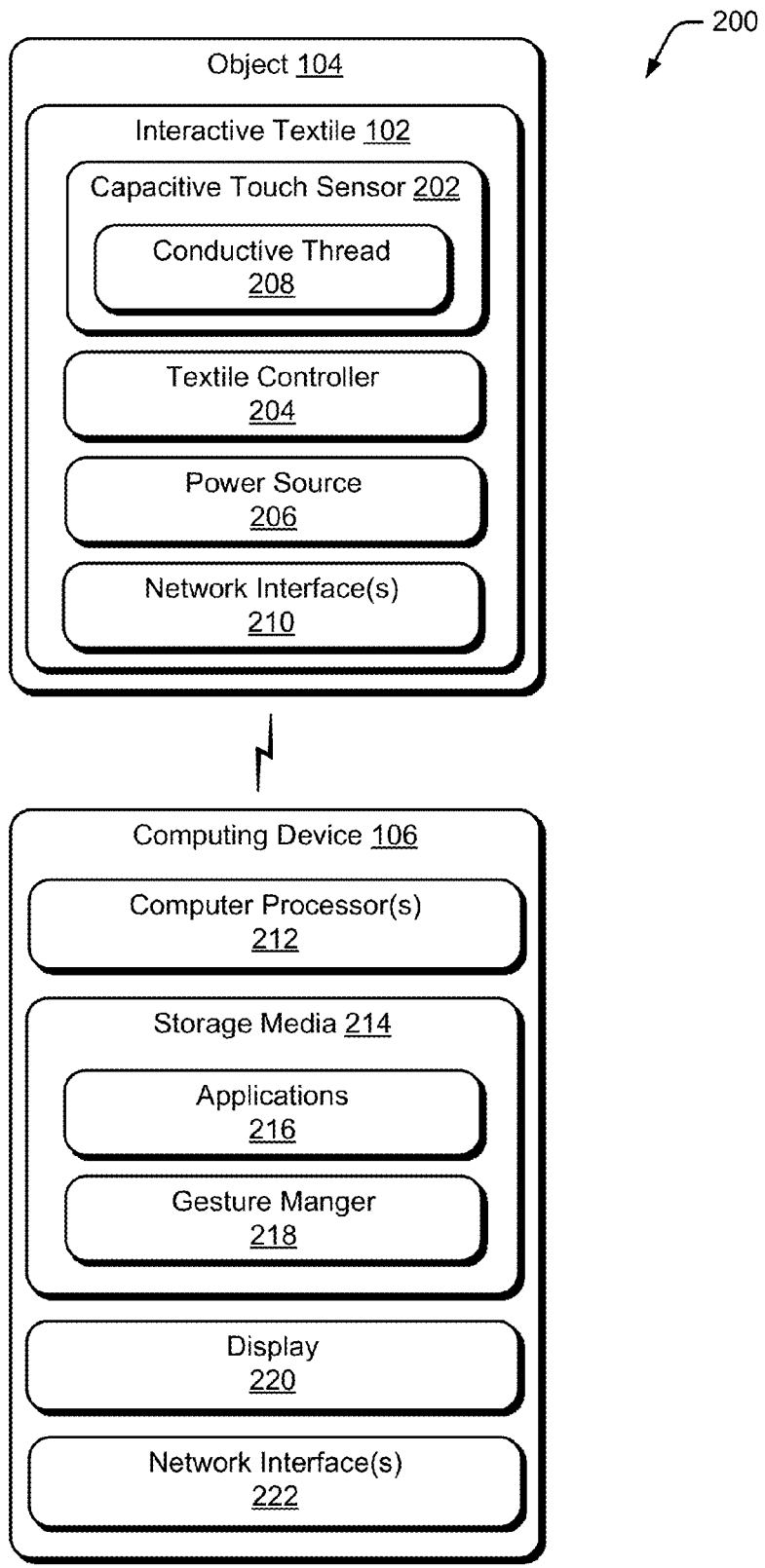
FIG. 2 illustrates an example system that includes an interactive textile and a gesture manager.

In more detail, consider FIG. 2 which illustrates an example system 200 that includes an interactive textile and a gesture manager. In system 200, interactive textile 102 is integrated in an object 104, which may be implemented as a flexible object (e.g., shirt 104-1, hat 104-2, or handbag 104-3) or a hard object (e.g., plastic cup 104-4 or smart phone casing 104-5).

Interactive textile 102 is configured to sense multi-touch-input from a user when one or more fingers of the user's hand touch interactive textile 102. Interactive textile 102 may also be configured to sense full-hand touch input from a user, such as when an entire hand of the user touches or swipes interactive textile 102. To enable this, interactive textile 102 includes a capacitive touch sensor 202, a textile controller 204, and a power source 206.

Capacitive touch sensor 202 is configured to sense touch-input when an object, such as a user's finger, hand, or a conductive stylus, approaches or makes contact with capacitive touch sensor 202. Unlike conventional hard touch pads, capacitive touch sensor 202 uses a grid of conductive thread 208 woven into interactive textile 102 to sense touch-input. Thus, capacitive touch sensor 202 does not alter the flexibility of interactive textile 102, which enables interactive textile 102 to be easily integrated within objects 104.

Power source 206 is coupled to textile controller 204 to provide power to textile controller 204, and may be implemented as a small battery. Textile controller 204 is coupled to capacitive touch sensor 202. For example, wires from the grid of conductive threads 208 may be connected to textile controller 204 using flexible PCB, creping, gluing with conductive glue, soldering, and so forth.

In one or more implementations, interactive textile 102 (or object 104) may also include one or more output devices, such as light sources (e.g., LED's), displays, or speakers. In this case, the output devices may also be connected to textile controller 204 to enable textile controller 204 to control their output.

Textile controller 204 is implemented with circuitry that is configured to detect the location of the touch-input on the grid of conductive thread 208, as well as motion of the touch-input. When an object, such as a user's finger, touches capacitive touch sensor 202, the position of the touch can be determined by controller 204 by detecting a change in capacitance on the grid of conductive thread 208. Textile controller 204 uses the touch-input to generate touch data usable to control computing device 102. For example, the touch-input can be used to determine various gestures, such as single-finger touches (e.g., touches, taps, and holds), multi-finger touches (e.g., two-finger touches, two-finger taps, two-finger holds, and pinches), single-finger and multi-finger swipes (e.g., swipe up, swipe down, swipe left, swipe right), and full-hand interactions (e.g., touching the textile with a user's entire hand, covering textile with the user's entire hand, pressing the textile with the user's entire hand, palm touches, and rolling, twisting, or rotating the user's hand while touching the textile). Capacitive touch sensor 202 may be implemented as a self-capacitance sensor, or a projective capacitance sensor, which is discussed in more detail below.

Object 104 may also include network interfaces 210 for communicating data, such as touch data, over wired, wireless, or optical networks to computing devices 106. By way of example and not limitation, network interfaces 210 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like (e.g., through network 108 of FIG. 1).

In this example, computing device 106 includes one or more computer processors 212 and computer-readable storage media (storage media) 214. Storage media 214 includes applications 216 and/or an operating system (not shown) embodied as computer-readable instructions executable by computer processors 212 to provide, in some cases, functionalities described herein. Storage media 214 also includes a gesture manager 218 (described below).

Computing device 106 may also include a display 220 and network interfaces 222 for communicating data over wired, wireless, or optical networks. For example, network interfaces 222 can receive touch data sensed by interactive textile 102 from network interfaces 210 of object 104. By way of example and not limitation, network interface 222 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like.

Gesture manager 218 is capable of interacting with applications 216 and interactive textile 102 effective to activate various functionalities associated with computing device 106 and/or applications 216 through touch-input (e.g., gestures) received by interactive textile 102. Gesture manager 218 may be implemented at a computing device 106 that is local to object 104, or remote from object 104.

Having discussed a system in which interactive textile 102 can be implemented, now consider a more-detailed discussion of interactive textile 102.

Figure 3:
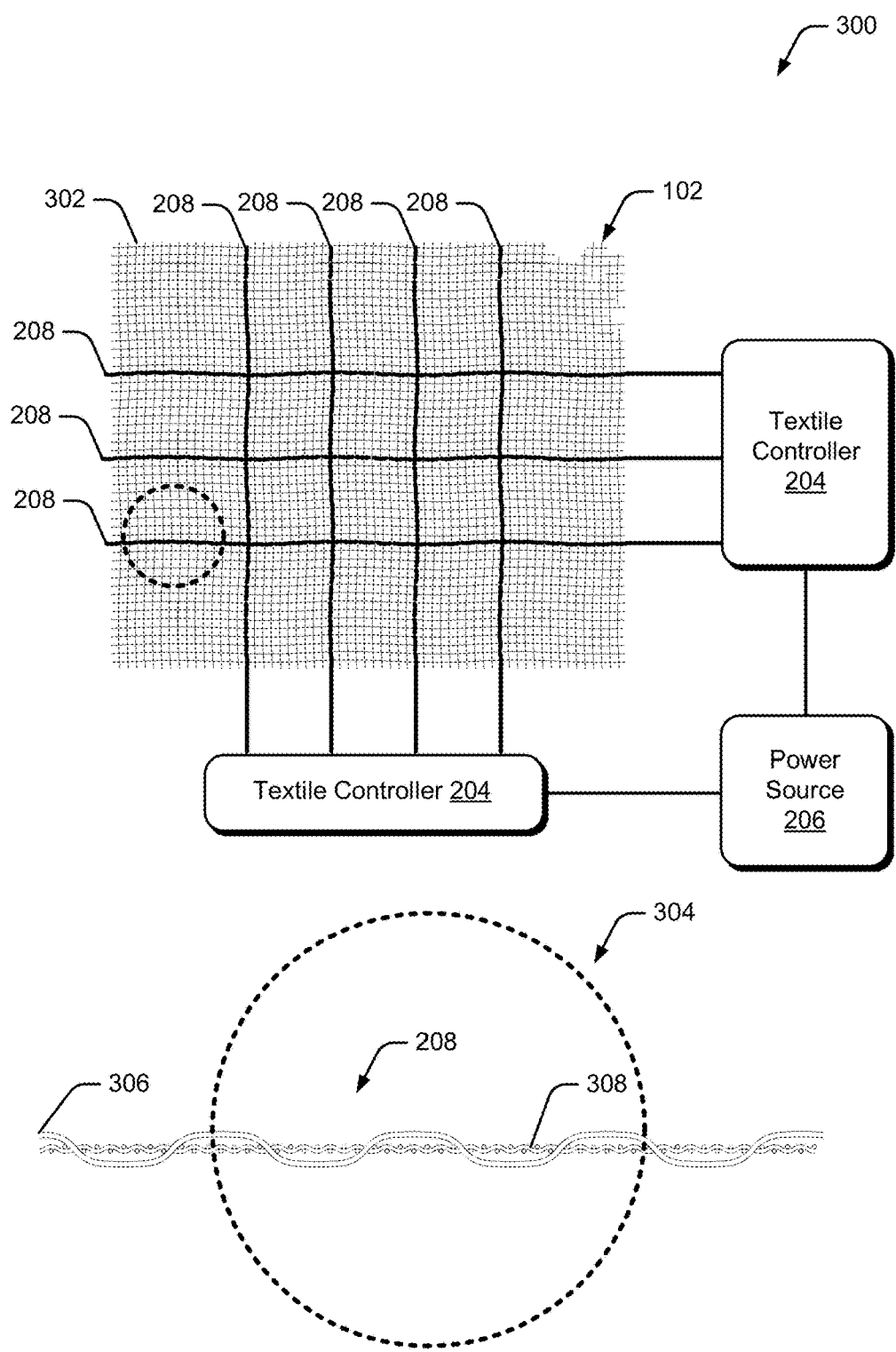
FIG. 3 illustrates an example of an interactive textile in accordance with one or more implementations.

FIG. 3 illustrates an example 300 of interactive textile 102 in accordance with one or more implementations. In this example, interactive textile 102 includes non-conductive threads 302 woven with conductive threads 208 to form interactive textile 102. Non-conductive threads 302 may correspond to any type of non-conductive thread, fiber, or fabric, such as cotton, wool, silk, nylon, polyester, and so forth.

At 304, a zoomed-in view of conductive thread 208 is illustrated. Conductive thread 208 includes a conductive wire 306 twisted with a flexible thread 308. Twisting conductive wire 306 with flexible thread 308 causes conductive thread 208 to be flexible and stretchy, which enables conductive thread 208 to be easily woven with non-conductive threads 302 to form interactive textile 102.

In one or more implementations, conductive wire 306 is a thin copper wire. It is to be noted, however, that conductive wire 306 may also be implemented using other materials, such as silver, gold, or other materials coated with a conductive polymer. Flexible thread 308 may be implemented as any type of flexible thread or fiber, such as cotton, wool, silk, nylon, polyester, and so forth.

In one or more implementations, conductive thread 208 includes a conductive core that includes at least one conductive wire 306 (e.g., one or more copper wires) and a cover layer, configured to cover the conductive core, that is constructed from flexible threads 308. In some cases, conductive wire 306 of the conductive core is insulated. Alternately, conductive wire 306 of the conductive core is not insulated.

In one or more implementations, the conductive core may be implemented using a single, straight, conductive wire 306. Alternately, the conductive core may be implemented using a conductive wire 306 and one or more flexible threads 308. For example, the conductive core may be formed by twisting one or more flexible threads 308 (e.g., silk threads, polyester threads, or cotton threads) with conductive wire 306 (e.g., as shown at 304 of FIG. 3), or by wrapping flexible threads 308 around conductive wire 306.

Figure 4A:
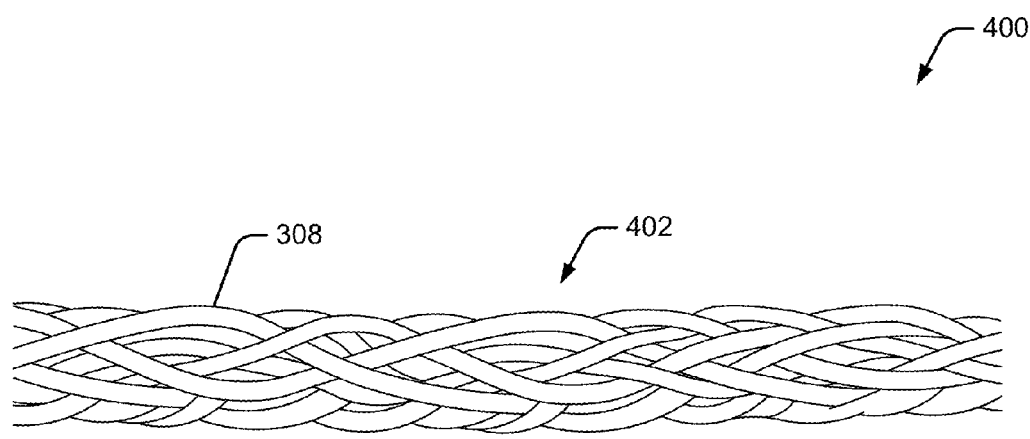
FIG. 4a which illustrates an example of a conductive core for a conductive thread in accordance with one or more implementations.

In one or more implementations, the conductive core includes flexible threads 308 braided with conductive wire 306. As an example, consider FIG. 4a which illustrates an example 400 of a conductive core 402 for a conductive thread in accordance with one or more implementations. In this example, conductive core 402 is formed by braiding conductive wire 306 (not pictured) with flexible threads 308. A variety of different types of flexible threads 308 may be utilized to braid with conductive wire 306, such as polyester or cotton, in order to form the conductive core.

In one or more implementations, however, silk threads are used for the braided construction of the conductive core. Silk threads are slightly twisted which enables the silk threads to "grip" or hold on to conductive wire 306. Thus, using silk threads may increase the speed at which the braided conductive core can be manufactured. In contrast, a flexible thread like polyester is slippery, and thus does not "grip" the conductive wire as well as silk. Thus, a slippery thread is more difficult to braid with the conductive wire, which may slow down the manufacturing process.

An additional benefit of using silk threads to create the braided conductive core is that silk is both thin and strong, which enables the manufacture of a thin conductive core that will not break during the interaction textile weaving process. A thin conductive core is beneficial because it enables the manufacturer to create whatever thickness they want for conductive thread 208 (e.g., thick or thin) when covering the conductive core with the second layer.

Figure 4B:
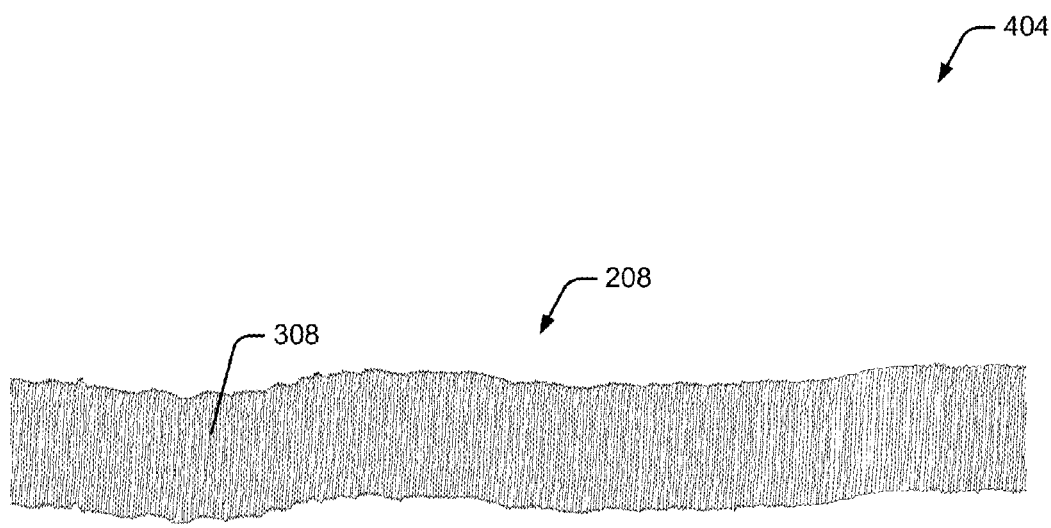
FIG. 4b which illustrates an example of a conductive thread that includes a cover layer formed by wrapping flexible threads around a conductive core.

After forming the conductive core, a cover layer is constructed to cover the conductive core. In one or more implementations, the cover layer is constructed by wrapping flexible threads (e.g., polyester threads, cotton threads, wool threads, or silk threads) around the conductive core. As an example, consider FIG. 4b which illustrates an example 404 of a conductive thread that includes a cover layer formed by wrapping flexible threads around a conductive core. In this example, conductive thread 208 is formed by wrapping flexible threads 308 around the conductive core (not pictured). For example, the cover layer may be formed by wrapping polyester threads around the conductive core at approximately 1900 turns per yard.

In one or more implementations, the cover layer includes flexible threads braided around the conductive core. The braided cover layer may be formed using the same type of braiding as described above with regards to FIG. 4a. Any type of flexible thread 308 may be used for the braided cover layer. The thickness of the flexible thread and the number of flexible threads that are braided around the conductive core can be selected based on the desired thickness of conductive thread 208. For example, if conductive thread 208 is intended to be used for denim, a thicker flexible thread (e.g., cotton) and/or a greater number of flexible threads may be used to form the cover layer.

In one or more implementations, conductive thread 208 is constructed with a "double-braided" structure. In this case, the conductive core is formed by braiding flexible threads, such as silk, with a conductive wire (e.g., copper), as described above. Then, the cover layer is formed by braiding flexible threads (e.g., silk, cotton, or polyester) around the braided conductive core. The double-braided structure is strong, and thus is unlikely to break when being pulled during the weaving process. For example, when the double-braided conductive thread is pulled, the braided structure contracts and forces the braided core of copper to contract also with makes the whole structure stronger. Further, the double-braided structure is soft and looks like normal yarn, as opposed to a cable, which is important for aesthetics and feel.

Interactive textile 102 can be formed cheaply and efficiently, using any conventional weaving process (e.g., jacquard weaving or 3D-weaving), which involves interlacing a set of longer threads (called the warp) with a set of crossing threads (called the weft). Weaving may be implemented on a frame or machine known as a loom, of which there are a number of types. Thus, a loom can weave non-conductive threads 302 with conductive threads 208 to create interactive textile 102.

In example 300, conductive thread 208 is woven into interactive textile 102 to form a grid that includes a set of substantially parallel conductive threads 208 and a second set of substantially parallel conductive threads 208 that crosses the first set of conductive threads to form the grid. In this example, the first set of conductive threads 208 are oriented horizontally and the second set of conductive threads 208 are oriented vertically, such that the first set of conductive threads 208 are positioned substantially orthogonal to the second set of conductive threads 208. It is to be appreciated, however, that conductive threads 208 may be oriented such that crossing conductive threads 208 are not orthogonal to each other. For example, in some cases crossing conductive threads 208 may form a diamond-shaped grid. While conductive threads 208 are illustrated as being spaced out from each other in FIG. 3, it is to be noted that conductive threads 208 may be weaved very closely together. For example, in some cases two or three conductive threads may be weaved closely together in each direction.

Conductive wire 306 may be insulated to prevent direct contact between crossing conductive threads 208. To do so, conductive wire 306 may be coated with a material such as enamel or nylon. Alternately, rather than insulating conductive wire 306, interactive textile may be generated with three separate textile layers to ensure that crossing conductive threads 208 do not make direct contact with each other.

Figure 5:
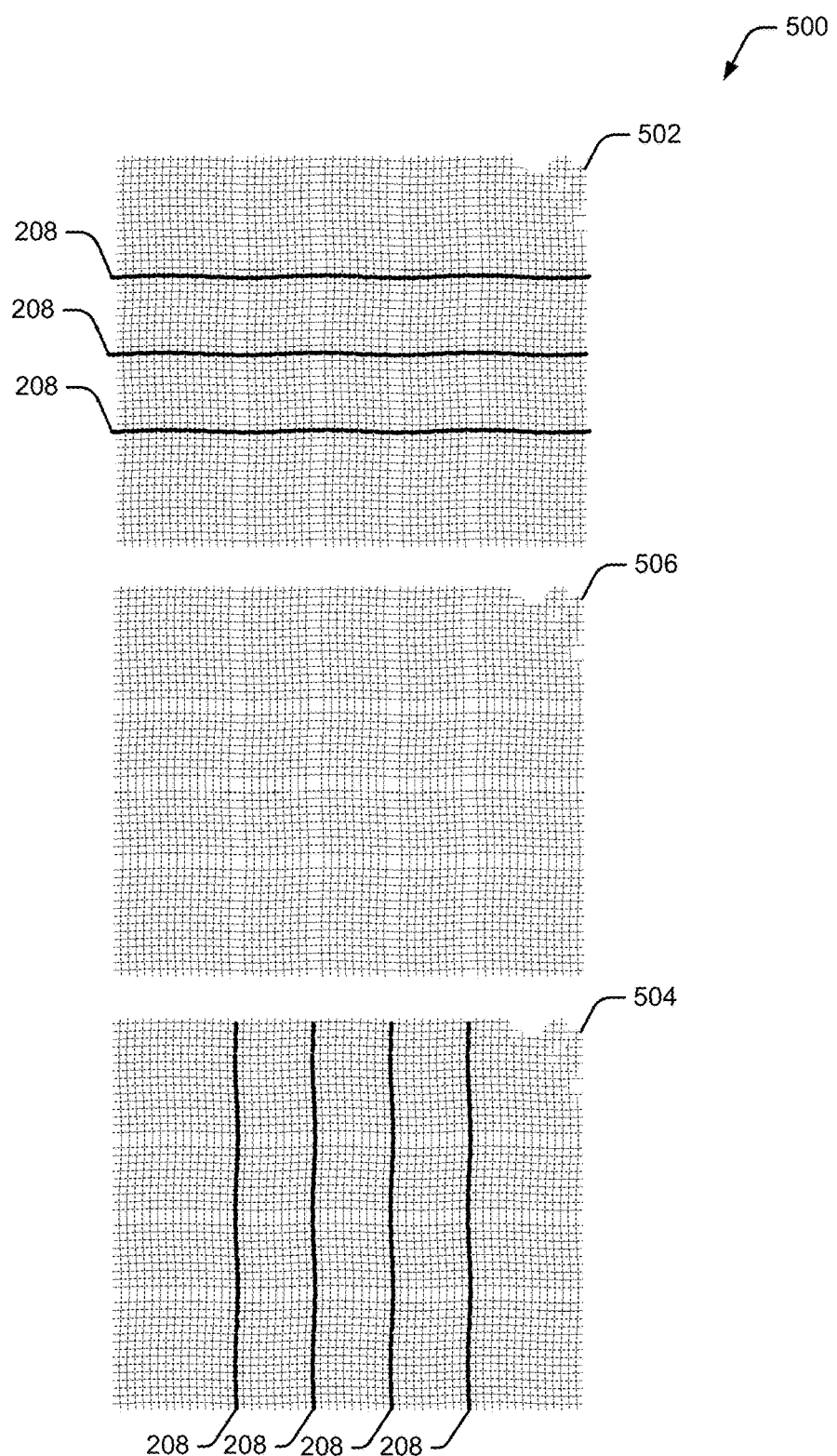
FIG. 5 illustrates an example of an interactive textile with multiple textile layers.

Consider, for example, FIG. 5 which illustrates an example 500 of an interactive textile 102 with multiple textile layers. In example 500, interactive textile 102 includes a first textile layer 502, a second textile layer 504, and a third textile layer 506. The three textile layers may be combined (e.g., by sewing or gluing the layers together) to form interactive textile 102. In this example, first textile layer 502 includes horizontal conductive threads 208, and second textile layer 504 includes vertical conductive threads 208. Third textile layer 506 does not include any conductive threads, and is positioned between first textile layer 502 and second textile layer 504 to prevent vertical conductive threads from making direct contact with horizontal conductive threads 208.

In one or more implementations, interactive textile 102 includes a top textile layer and a bottom textile layer. The top textile layer includes conductive threads 208 woven into the top textile layer, and the bottom textile layer also includes conductive threads woven into the bottom textile layer. When the top textile layer is combined with the bottom textile layer, the conductive threads from each layer form capacitive touch sensor 202.

Figure 6:
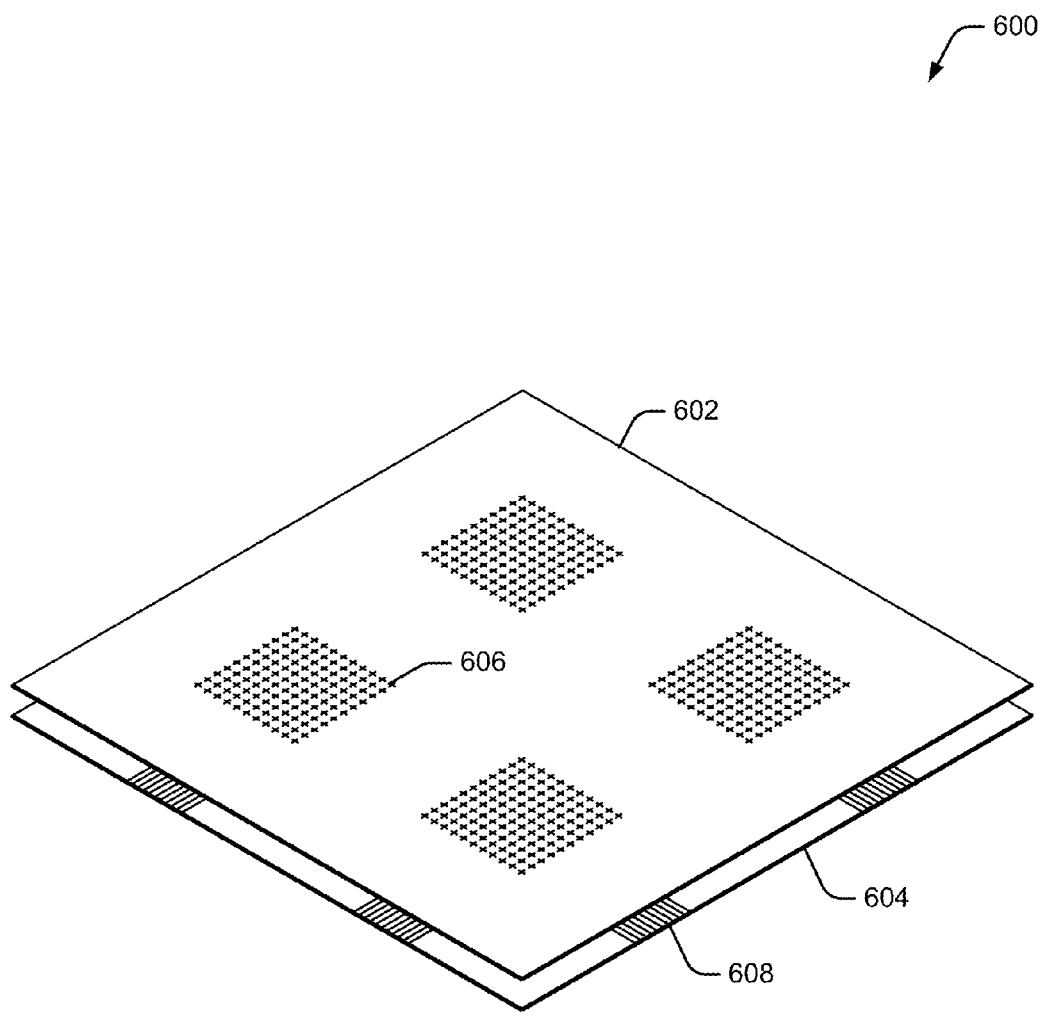
FIG. 6 illustrates an example of a two-layer interactive textile in accordance with one or more implementations.

Consider for example, FIG. 6 which illustrates an example 600 of a two-layer interactive textile 102 in accordance with one or more implementations. In this example, interactive textile 102 includes a first textile layer 602 and a second textile layer 604. First textile layer 602 is considered the "top textile layer" and includes first conductive threads 606 woven into first textile layer 602. Second textile layer 604 is considered the "bottom textile layer" of interactive textile 102 and includes second conductive threads 608 woven into second textile layer 604. When integrated into flexible object 104, such as a clothing item, first textile layer 602 is visible and faces the user such that the user is able to interact with first textile layer 602, while second textile layer 604 is not visible. For instance, first textile layer 602 may be part of an "outside surface" of the clothing item, while second textile layer may be the "inside surface" of the clothing item.

When first textile layer 602 and second textile layer 604 are combined, first conductive threads 606 of first textile layer 602 couples to second conductive threads 608 of second textile layer 604 to form capacitive touch sensor 202, as described above. In one or more implementations, the direction of the conductive threads changes from first textile layer 602 to second textile layer 604 to form a grid of conductive threads, as described above. For example, first conductive threads 606 in first textile layer 602 may be positioned substantially orthogonal to second conductive threads 608 in second textile layer 604 to form the grid of conductive threads.

In some cases, first conductive threads 606 may be oriented substantially horizontally and second conductive threads 608 may be oriented substantially vertically. Alternately, first conductive threads 606 may be oriented substantially vertically and second conductive threads 608 may be oriented substantially horizontally. Alternately, first conductive threads 606 may be oriented such that crossing conductive threads 608 are not orthogonal to each other. For example, in some cases crossing conductive threads 606 and 608 may form a diamond-shaped grid.

First textile layer 602 and second textile layer 604 can be formed independently, or at different times. For example, a manufacturer may weave second conductive threads 608 into second textile layer 604. A designer could then purchase second textile layer 604 with the conductive threads already woven into the second textile layer 604, and create first textile layer 602 by weaving conductive thread into a textile design. First textile layer 602 can then be combined with second textile layer 604 to form interactive textile 102.

First textile layer and second textile layer may be combined in a variety of different ways, such as by weaving, sewing, or gluing the layers together to form interactive textile 102. In one or more implementations, first textile layer 602 and second textile layer 604 are combined using a jacquard weaving process or any type of 3D-weaving process. When first textile layer 602 and second textile layer 604 are combined, the first conductive threads 606 of first textile layer 602 couple to second conductive threads 608 of second textile layer 604 to form capacitive touch sensor 202, as described above.

Figure 7:
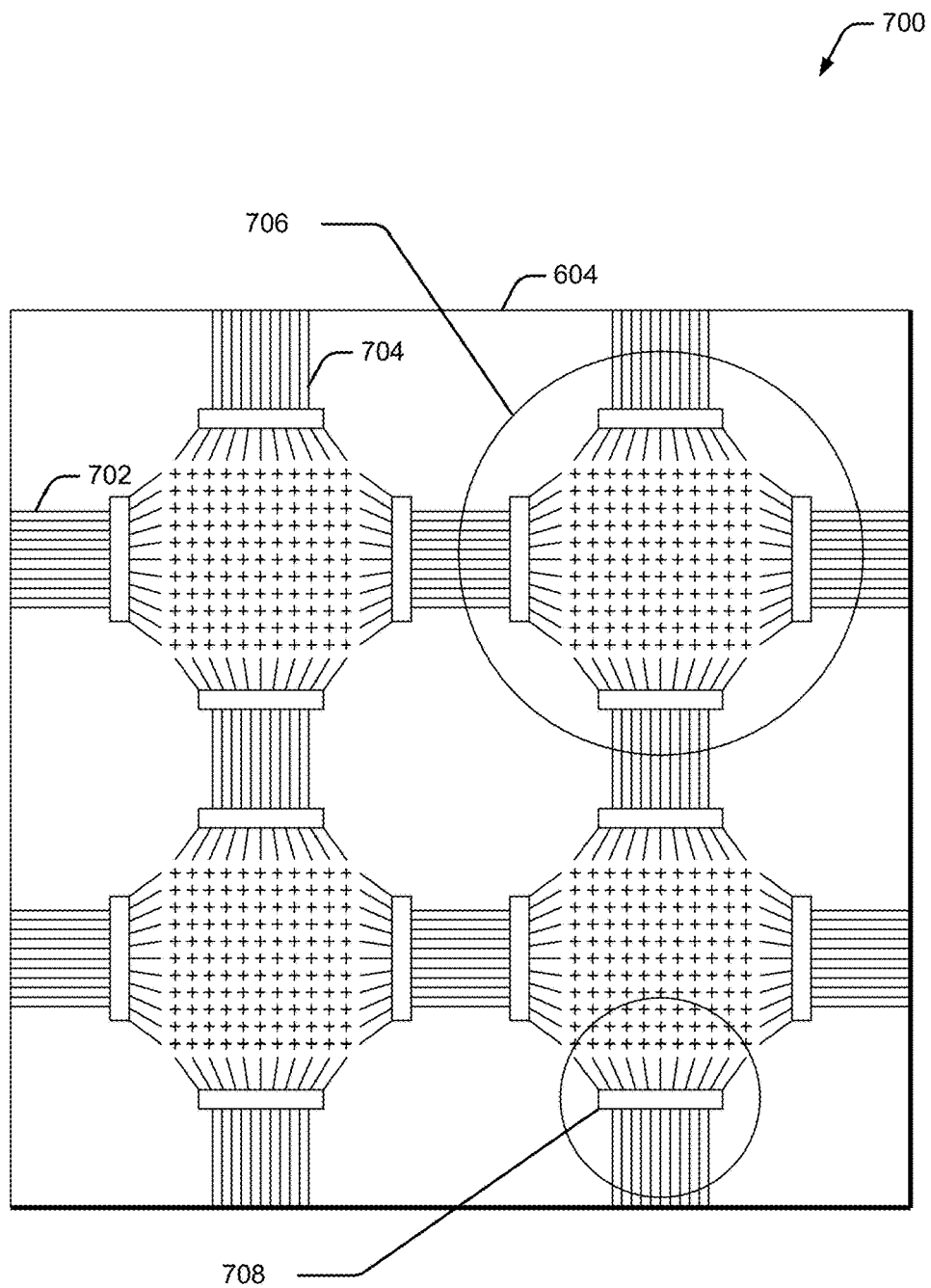
FIG. 7 illustrates a more-detailed view of a second textile layer of a two-layer interactive textile in accordance with one or more implementations.

In one or more implementations, second textile layer 604 implements a standard configuration or pattern of second conductive threads 608. Consider, for example, FIG. 7 which illustrates a more-detailed view 700 of second textile layer 604 of two-layer interactive textile 102 in accordance with one or more implementations. In this example, second textile layer 604 includes horizontal conductive threads 702 and vertical conductive threads 704 which intersect to form multiple grids 706 of conductive thread. It is to be noted, however, that any standard configuration may be used, such as different sizes of grids or just lines without grids. The standard configuration of second conductive threads 608 in the second level enables a precise size, shape, and placement of interactive areas anywhere on interactive textile 102. In example 700, second textile layer 604 utilizes connectors 708 to form grids 706. Connectors 708 may be configured from a harder material, such as polyester.

Second conductive threads 608 of second textile layer 604 can be connected to electronic components of interactive textile 102, such as textile controller 204, output devices (e.g., an LED, display, or speaker), and so forth. For example, second conductive threads 608 of second textile layer 604 may be connected to electronic components, such as textile controller 204, using flexible PCB, creping, gluing with conductive glue, soldering, and so forth. Since second textile layer 604 is not visible, this enables coupling to the electronics in a way that the electronics and lines running to the electronics are not visible in the clothing item or soft object.

Figure 8:
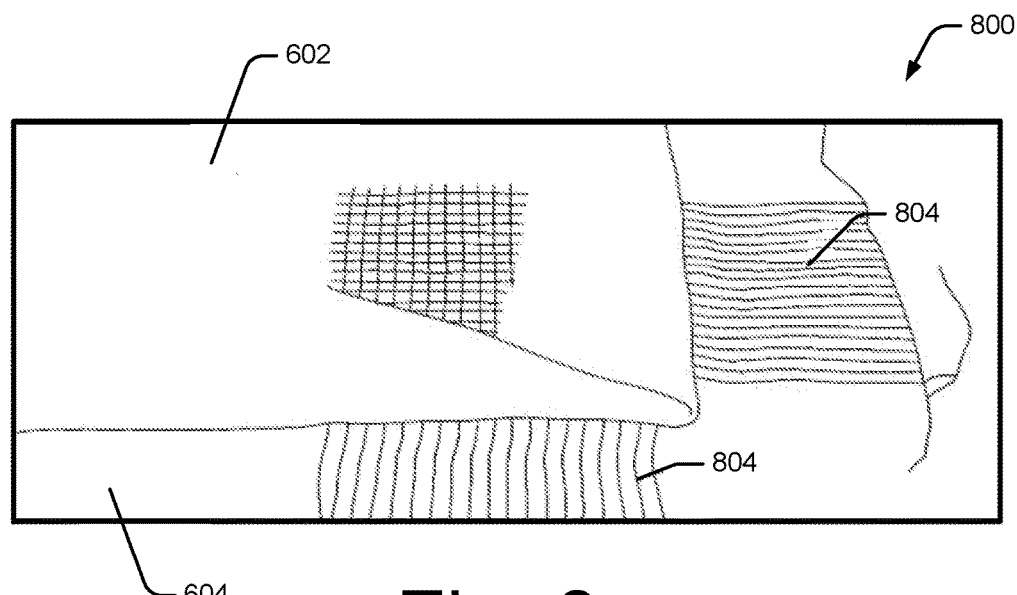
FIG. 8 illustrates an example of a second textile layer of a two-layer interactive textile in accordance with one or more implementations.

In one or more implementations, the pitch of second conductive threads 608 in second textile layer 604 is constant. As described herein, the "pitch" of the conductive threads refers to a width of the line spacing between conductive threads. Consider, for example, FIG. 8 which illustrates an additional example 800 of second textile layer 604 in accordance with one or more implementations. In this example, first textile layer 602 is illustrated as being folded back to reveal second textile layer 604. Horizontal conductive threads 802 and vertical conductive threads 804 are completely woven into second textile layer 604. As can be seen, the distance between each of the lines does not change, and thus the pitch is considered to be constant.

Alternately, in one or more implementations, the pitch of second conductive threads 608 in second textile layer 604 is not constant. The pitch can be varied in a variety of different ways. In one or more implementations, the pitch can be changed using shrinking materials, such as heat shrinking polymers. For example, the pitch can be changed by weaving polyester or heated yarn with the conductive threads of the second textile layer.

Figure 9:
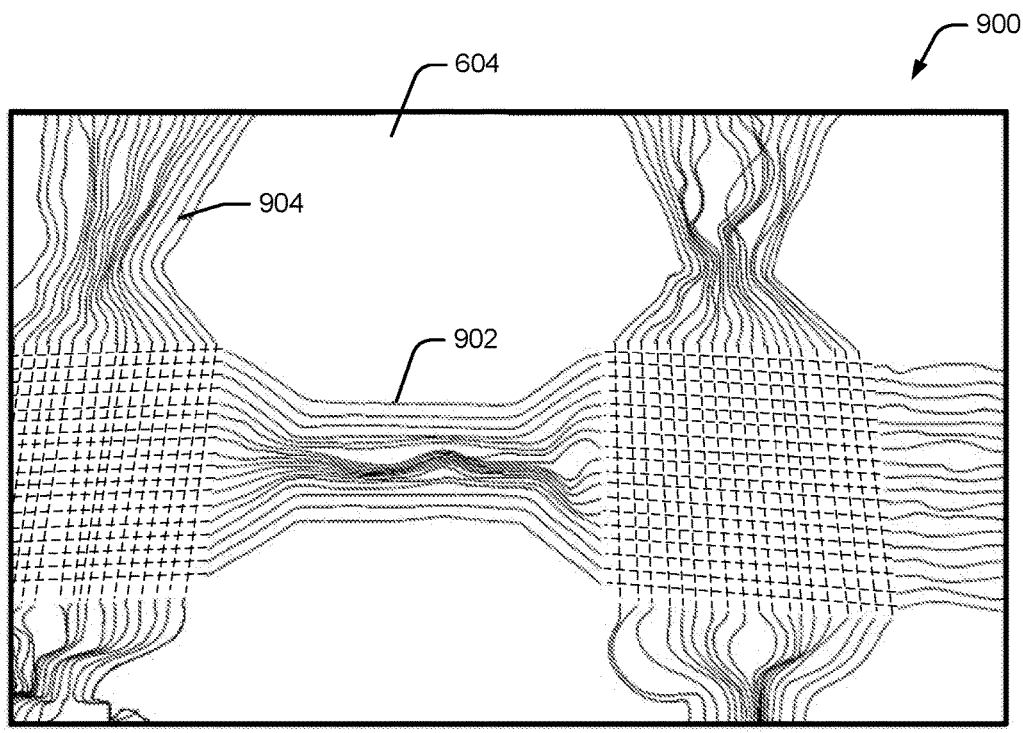
FIG. 9 illustrates an additional example of a second textile layer of a two-layer interactive textile in accordance with one or more implementations.

In one or more implementations second conductive threads 608 may be partially woven into the second textile layer 604. Then, the pitch of second conductive threads 608 can be changed by weaving first textile layer 602 with second textile layer 604. Consider, for example, FIG. 9 which illustrates an additional example 900 of a second textile layer 604 in accordance with one or more implementations. In this example, horizontal conductive threads 902 and vertical conductive threads 904 are only partially woven into second textile layer 604. The pitch of the horizontal and vertical conductive threads can then be altered by weaving first textile layer 602 with second textile layer 604.

During operation, capacitive touch sensor 202 may be configured to determine positions of touch-input on the grid of conductive thread 208 using self-capacitance sensing or projective capacitive sensing.

When configured as a self-capacitance sensor, textile controller 204 charges crossing conductive threads 208 (e.g., horizontal and vertical conductive threads) by applying a control signal (e.g., a sine signal) to each conductive thread 208. When an object, such as the user's finger, touches the grid of conductive thread 208, the conductive threads 208 that are touched are grounded, which changes the capacitance (e.g., increases or decreases the capacitance) on the touched conductive threads 208.

Textile controller 204 uses the change in capacitance to identify the presence of the object. To do so, textile controller 204 detects a position of the touch-input by detecting which horizontal conductive thread 208 is touched, and which vertical conductive thread 208 is touched by detecting changes in capacitance of each respective conductive thread 208. Textile controller 204 uses the intersection of the crossing conductive threads 208 that are touched to determine the position of the touch-input on capacitive touch sensor 202. For example, textile controller 204 can determine touch data by determining the position of each touch as X,Y coordinates on the grid of conductive thread 208.

When implemented as a self-capacitance sensor, "ghosting" may occur when multi-touch input is received. Consider, for example, that a user touches the grid of conductive thread 208 with two fingers. When this occurs, textile controller 204 determines X and Y coordinates for each of the two touches. However, textile controller 204 may be unable to determine how to match each X coordinate to its corresponding Y coordinate. For example, if a first touch has the coordinates X1, Y1 and a second touch has the coordinates X4,Y4, textile controller 204 may also detect "ghost" coordinates X1, Y4 and X4,Y1.

In one or more implementations, textile controller 204 is configured to detect "areas" of touch-input corresponding to two or more touch-input points on the grid of conductive thread 208. Conductive threads 208 may be weaved closely together such that when an object touches the grid of conductive thread 208, the capacitance will be changed for multiple horizontal conductive threads 208 and/or multiple vertical conductive threads 208. For example, a single touch with a single finger may generate the coordinates X1,Y1 and X2,Y1. Thus, textile controller 204 may be configured to detect touch-input if the capacitance is changed for multiple horizontal conductive threads 208 and/or multiple vertical conductive threads 208. Note that this removes the effect of ghosting because textile controller 204 will not detect touch-input if two single-point touches are detected which are spaced apart.

Alternately, when implemented as a projective capacitance sensor, textile controller 204 charges a single set of conductive threads 208 (e.g., horizontal conductive threads 208) by applying a control signal (e.g., a sine signal) to the single set of conductive threads 208. Then, textile controller 204 senses changes in capacitance in the other set of conductive threads 208 (e.g., vertical conductive threads 208).

In this implementation, vertical conductive threads 208 are not charged and thus act as a virtual ground. However, when horizontal conductive threads 208 are charged, the horizontal conductive threads capacitively couple to vertical conductive threads 208. Thus, when an object, such as the user's finger, touches the grid of conductive thread 208, the capacitance changes on the vertical conductive threads (e.g., increases or decreases). Textile controller 204 uses the change in capacitance on vertical conductive threads 208 to identify the presence of the object. To do so, textile controller 204 detects a position of the touch-input by scanning vertical conductive threads 208 to detect changes in capacitance. Textile controller 204 determines the position of the touch-input as the intersection point between the vertical conductive thread 208 with the changed capacitance, and the horizontal conductive thread 208 on which the control signal was transmitted. For example, textile controller 204 can determine touch data by determining the position of each touch as X,Y coordinates on the grid of conductive thread 208.

Whether implemented as a self-capacitance sensor or a projective capacitance sensor, capacitive sensor 208 is configured to communicate the touch data to gesture manager 218 to enable gesture manager 218 to determine gestures based on the touch data, which can be used to control object 104, computing device 106, or applications 216 at computing device 106.

Gesture manager 218 can be implemented to recognize a variety of different types of gestures, such as touches, taps, swipes, holds, and covers made to interactive textile 102. To recognize the various different types of gestures, gesture manager 218 is configured to determine a duration of the touch, swipe, or hold (e.g., one second or two seconds), a number of the touches, swipes, or holds (e.g., a single tap, a double tap, or a triple tap), a number of fingers of the touch, swipe, or hold (e.g., a one finger-touch or swipe, a two-finger touch or swipe, or a three-finger touch or swipe), a frequency of the touch, and a dynamic direction of a touch or swipe (e.g., up, down, left, right). With regards to holds, gesture manager 218 can also determine an area of capacitive touch sensor 202 of interactive textile 102 that is being held (e.g., top, bottom, left, right, or top and bottom. Thus, gesture manager 218 can recognize a variety of different types of holds, such as a cover, a cover and hold, a five finger hold, a five finger cover and hold, a three finger pinch and hold, and so forth.

Figure 10A:
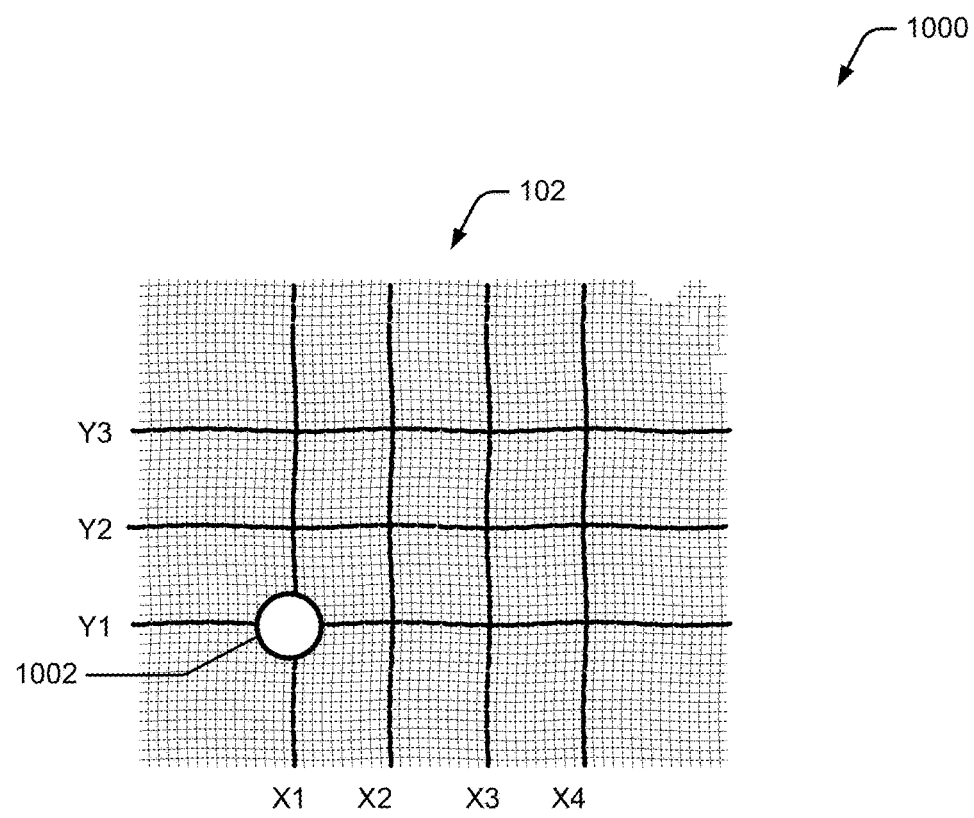
FIG. 10A illustrates an example of generating a control based on touch-input corresponding to a single-finger touch.
Figure 10A:
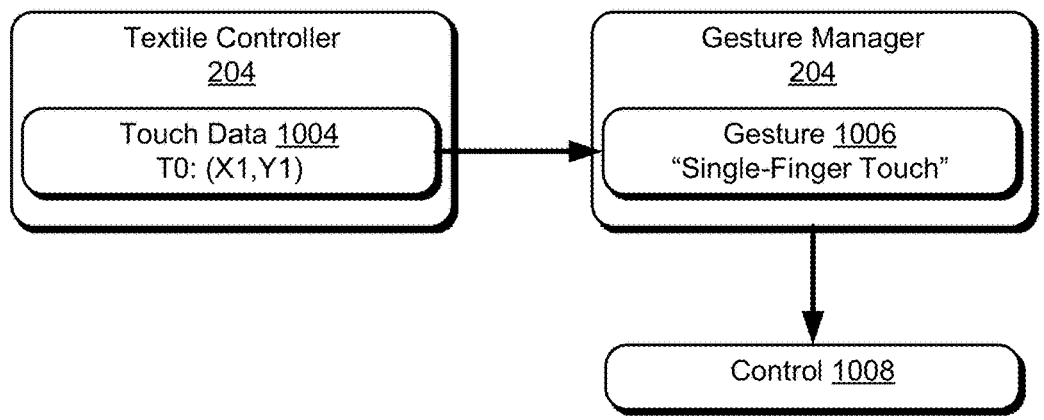

FIG. 10A illustrates an example 1000 of generating a control based on touch-input corresponding to a single-finger touch. In example 1000, horizontal conductive threads 208 and vertical conductive threads 208 of capacitive touch sensor 202 form an X,Y grid. The X-axis in this grid is labeled X1, X2, X3, and X4, and the Y-axis is labeled Y1, Y2, and Y3. As described above, textile controller 204 can determine the location of each touch on this X,Y grid using self-capacitance sensing or projective capacitance sensing.

In this example, touch-input 1002 is received when a user touches interactive textile 102. When touch-input 1002 is received, textile controller 204 determines the position and time of touch-input 1002 on the grid of conductive thread 208, and generates touch data 1004 which includes the position of the touch: "X1,Y1", and a time of the touch: T0. Then, touch data 1004 is communicated to gesture manager 218 at computing device 106 (e.g., over network 108 via network interface 210).

Gesture manager 218 receives touch data 1004, and generates a gesture 1006 corresponding to touch data 1004. In this example, gesture manager 218 determines gesture 1006 to be "single-finger touch" because the touch data corresponds to a single touch-input point (X1,Y1) at a single time period (T0). Gesture manager 218 may then initiate a control 1008 to activate a functionality of computing device 106 based on the single-finger touch gesture 1006 to control object 104, computing device 106, or an application 216 at computing device 106. A single-finger touch gesture, for example, may be used to control computing device 106 to power-on or power-off, to control an application 216 to open or close, to control lights in the user's house to turn on or off, and so on.

Figure 10B:
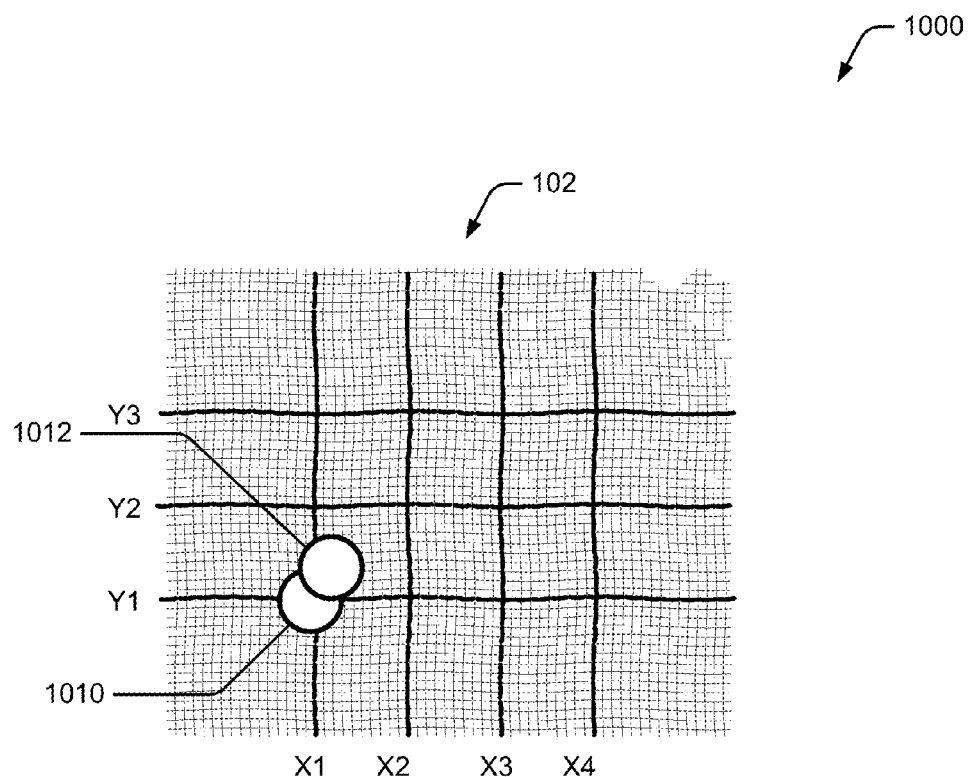
FIG. 10B illustrates an example of generating a control based on touch-input corresponding to a double-tap.
Figure 10B:
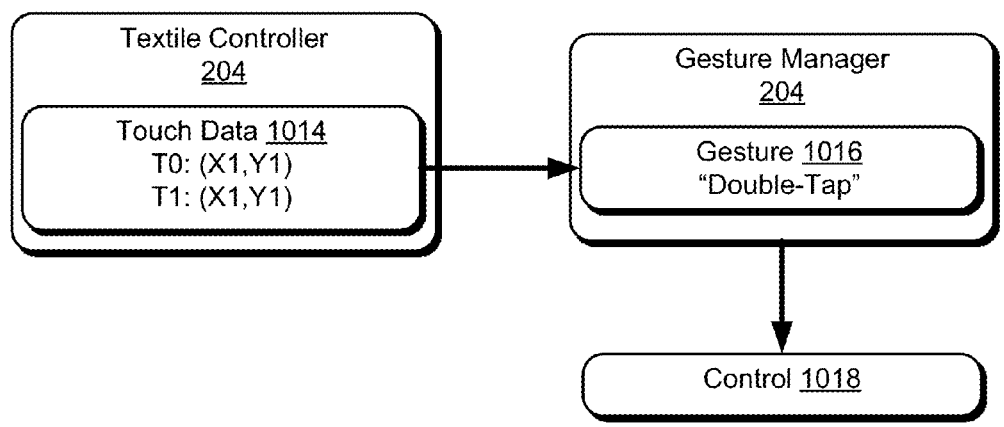

FIG. 10B illustrates an example 1000 of generating a control based on touch-input corresponding to a double-tap. In this example, touch-input 1010 and 1012 is received when a user double taps interactive textile 102, such as by quickly tapping interactive textile 102. When touch-input 1010 and 1012 is received, textile controller 204 determines the positions and time of the touch-input on the grid of conductive thread 208, and generates touch data 1014 which includes the position of the first touch: "X1,Y1", and a time of the first touch: T0. The touch data 1014 further includes the position of the second touch: "X1,Y1", and the time of the second touch: T1. Then, touch data 1014 is communicated to gesture manager 218 at computing device 106 (e.g., over network 108 via network interface 210).

Gesture manager 218 receives touch data 1014, and generates a gesture 1016 corresponding to the touch data. In this example, gesture manager 218 determines gesture 1016 as a "double-tap" based on two touches being received at substantially the same position at different times. Gesture manager 218 may then initiate a control 1018 to activate a functionality of computing device 106 based on the double-tap touch gesture 1016 to control object 104, computing device 106, or an application 216 at computing device 106. A double-tap gesture, for example, may be used to control computing device 106 to power-on an integrated camera, start the play of music via a music application 216, lock the user's house, and so on.

Figure 10C:
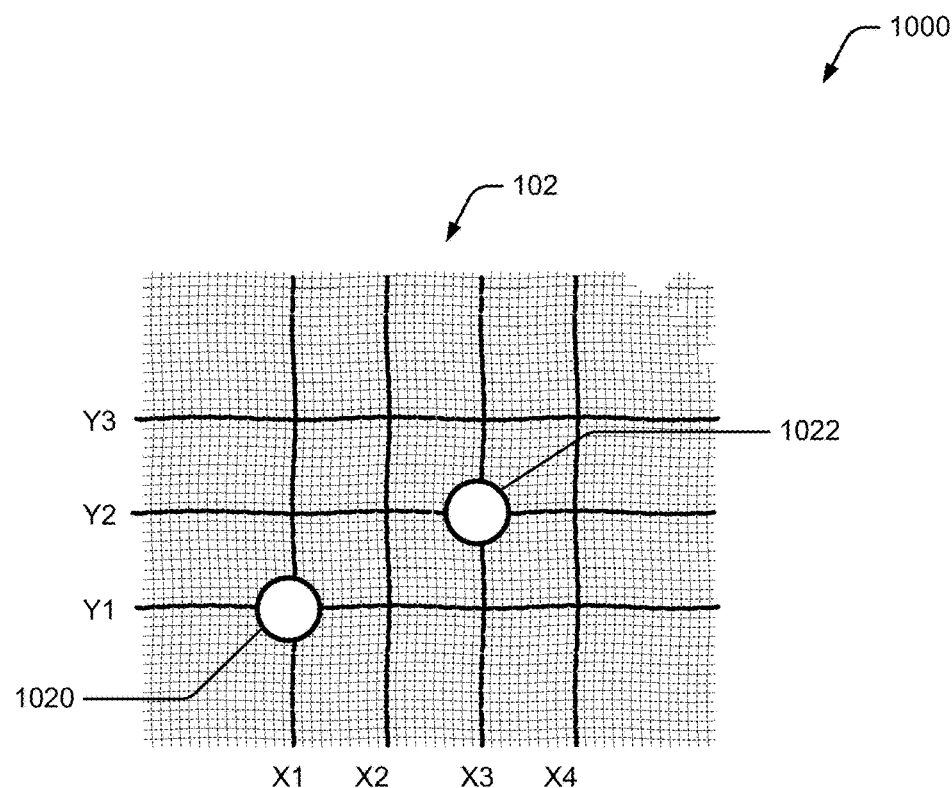
FIG. 10C illustrates an example of generating a control based on touch-input corresponding to a two-finger touch.
Figure 10C:
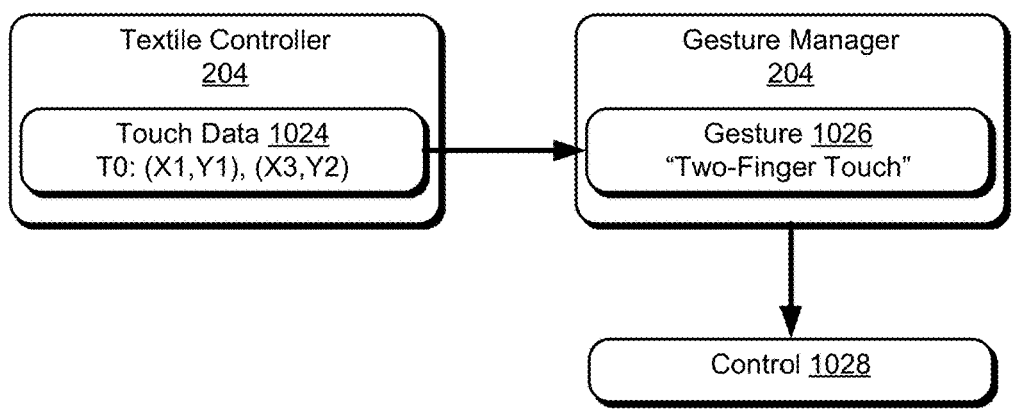

FIG. 10C illustrates an example 1000 of generating a control based on touch-input corresponding to a two-finger touch. In this example, touch-input 1020 and 1022 is received when a user touches interactive textile 102 with two fingers at substantially the same time. When touch-input 1020 and 1022 is received, textile controller 204 determines the positions and time of the touch-input on the grid of conductive thread 208, and generates touch data 1024 which includes the position of the touch by a first finger: "X1,Y1", at a time T0. Touch data 1024 further includes the position of the touch by a second finger: "X3,Y2", at the same time T0. Then, touch data 1024 is communicated to gesture manager 218 at computing device 106 (e.g., over network 108 via network interface 210).

Gesture manager 218 receives touch data 1024, and generates a gesture 1026 corresponding to the touch data. In this case, gesture manager 218 determines gesture 1026 as a "two-finger touch" based on two touches being received in different positions at substantially the same time. Gesture manager may then initiate a control 1028 to activate a functionality of computing device 106 based on two-finger touch gesture 1026 to control object 104, computing device 106, or an application 216 at computing device 106. A two-finger touch gesture, for example, may be used to control computing device 106 to take a photo using an integrated camera, pause the playback of music via a music application 216, turn on the security system at the user's house and so on.

Figure 10D:
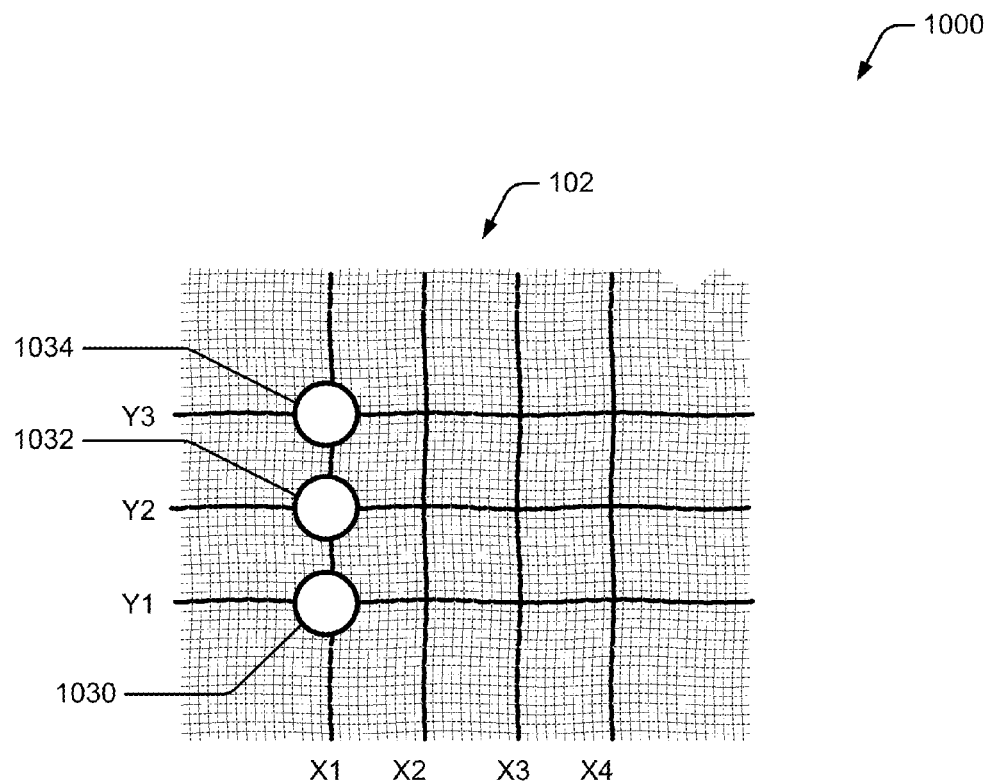
FIG. 10D illustrates an example of generating a control based on touch-input corresponding to a swipe up.
Figure 10D:
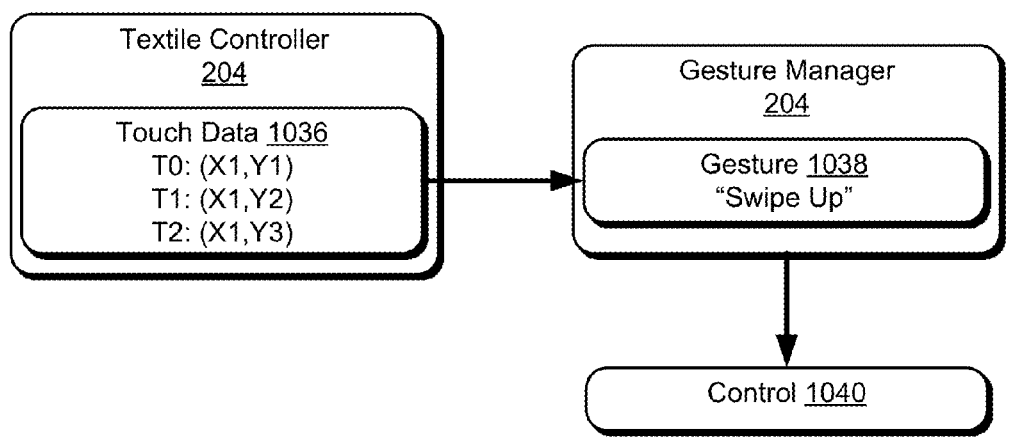

FIG. 10D which illustrates an example 1000 of generating a control based on touch-input corresponding to a single-finger swipe up. In this example, touch-input 1030, 1032, and 1034 is received when a user swipes upwards on interactive textile 102 using a single finger. When touch-input 1030, 1032, and 1034 is received, textile controller 204 determines the positions and time of the touch-input on the grid of conductive thread 208, and generates touch data 1036 corresponding to the position of a first touch as "X1,Y1" at a time T0, a position of a second touch as "X1,Y2" at a time T1, and a position of a third touch as "X1,Y3" at a time T2. Then, touch data 1036 is communicated to gesture manager 218 at computing device 106 (e.g., over network 108 via network interface 210).

Gesture manager 218 receives touch data 1036, and generates a gesture 1038 corresponding to the touch data. In this case, the gesture manager 218 determines gesture 1038 as a "swipe up" based on three touches being received in positions moving upwards on the grid of conductive thread 208. Gesture manager may then initiate a control 1040 to activate a functionality of computing device 106 based on the swipe up gesture 1038 to control object 104, computing device 106, or an application 216 at computing device 106. A swipe up gesture, for example, may be used to control computing device 106 to accept a phone call, increase the volume of music being played by a music application 216, or turn on lights in the user's house.

While examples above describe, generally, various types of touch-input gestures that are recognizable by interactive textile 102, it is to be noted that virtually any type of touch-input gestures may be detected by interactive textile 102. For example, any type of single or multi-touch taps, touches, holds, swipes, and so forth, that can be detected by conventional touch-enabled smart phones and tablet devices, may also be detected by interactive textile 102.

In one or more implementations, gesture manager 218 enables the user to create gestures and assign the gestures to functionality of computing device 106. The created gestures may include taps, touches, swipes and holds as described above. In addition, gesture manager 218 can recognize gesture strokes, such as gesture strokes corresponding to symbols, letters, numbers, and so forth.

Figure 11:
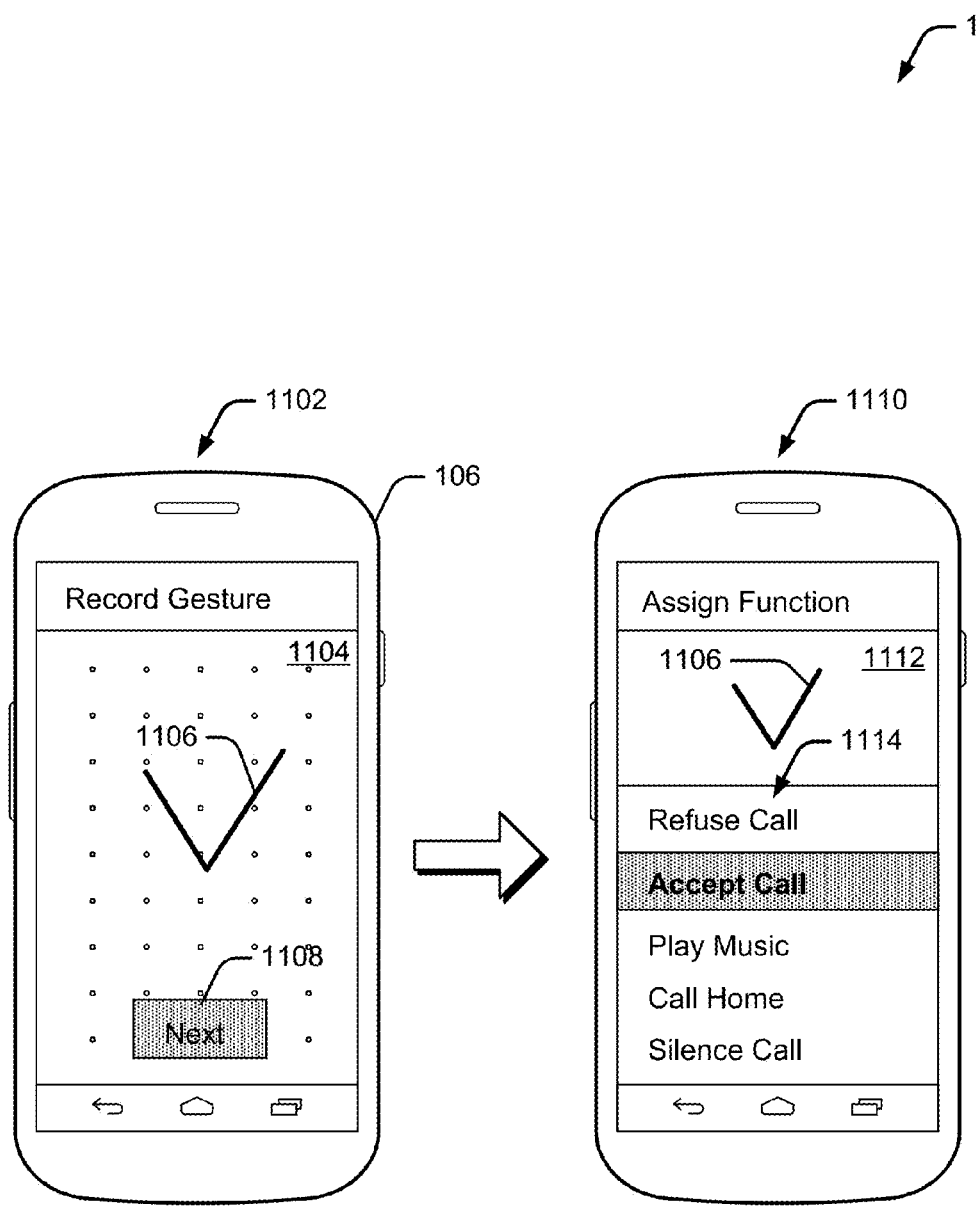
FIG. 11 illustrates an example of creating and assigning gestures to functionality of a computing device in accordance with one or more implementations.

Consider, for example, FIG. 11 which illustrates an example 1100 of creating and assigning gestures to functionality of computing device 106 in accordance with one or more implementations.

In this example, at a first stage 1102, gesture manager 218 causes display of a record gesture user interface 1104 on a display of computing device 106 during a gesture mapping mode. The gesture mapping mode may be initiated by gesture manager 218 automatically when interactive textile 102 is paired with computing device 106, or responsive to a control or command initiated by the user to create and assign gestures to functionalities of computing device 106.

In the gesture mapping mode, gesture manager 218 prompts the user to input a gesture to interactive textile 102. Textile controller 204, at interactive textile 102, monitors for gesture input to interactive textile 102 woven into an item of clothing (e.g., a jacket) worn by the user, and generates touch data based on the gesture. The touch data is then communicated to gesture manager 218.

In response to receiving the touch data from interactive textile 102, gesture manager 218 analyzes the touch data to identify the gesture. Gesture manager 218 may then cause display of a visual representation 1106 of the gesture on display 220 of computing device 106. In this example, visual representation 1106 of the gesture is a "v" which corresponds to the gesture that is input to interactive textile 102. Gesture user interface includes a next control 1108 which enables the user to transition to a second stage 1110.

At second stage 1110, gesture manager 218 enables the user to assign the gesture created at first stage 1102 to a functionality of computing device 106. As described herein, a "functionality" of computing device 106 can include any command, control, or action at computing device 102. Examples of functionalities of computing device 106 may include, by way of example and not limitation, answering a call, music playing controls (e.g., next song, previous song, pause, and play), requesting the current weather, and so forth.

In this example, gesture manager 218 causes display of an assign function user interface 1112 which enables the user to assign the gesture created at first stage 1102 to one or more functionalities of computing device 102. Assign function user interface 1112 includes a list 1114 of functionalities that are selectable by the user to assign or map the gesture to the selected functionality. In this example, list 1114 of functionalities includes "refuse call", "accept call", "play music", "call home", and "silence call".

Gesture manager receives user input to assign function user interface 1112 to assign the gesture to a functionality, and assigns the gesture to the selected functionality. In this example, the user selects the "accept call" functionality, and gesture manager 218 assigns the "v" gesture created at first stage 1102 to the accept call functionality.

Assigning the created gesture to the functionality of computing device 106 enables the user to initiate the functionality, at a subsequent time, by inputting the gesture into interactive textile 102. In this example, the user can now make the "v" gesture on interactive textile 102 in order to cause computing device 106 to accept a call to computing device 106.

Gesture manager 218 is configured to maintain mappings between created gestures and functionalities of computing device 106 in a gesture library. The mappings can be created by the user, as described above. Alternately or additionally, the gesture library can include predefined mappings between gestures and functionalities of computing device 106.

Figure 12:
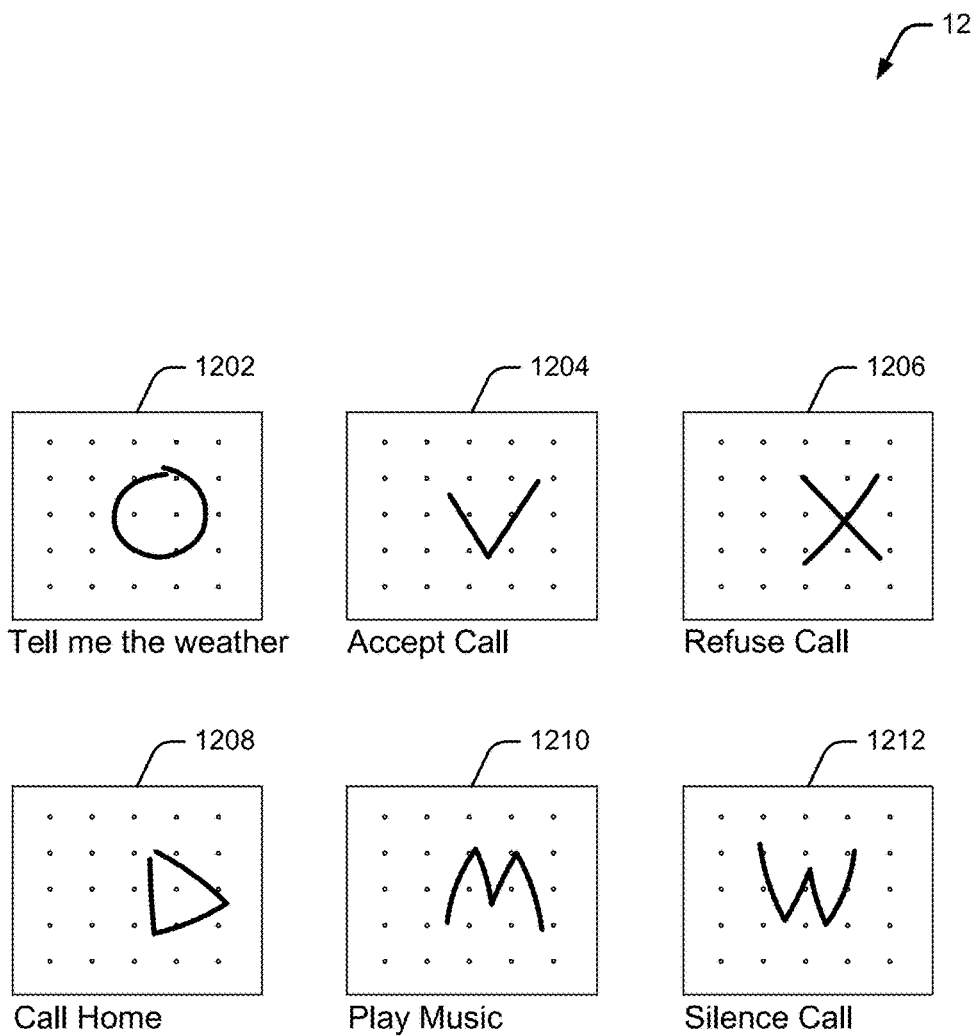
FIG. 12 illustrates an example of a gesture library in accordance with one or more implementations.

As an example, consider FIG. 12 which illustrates an example 1200 of a gesture library in accordance with one or more implementations. In example 1200, the gesture library includes multiple different mappings between gestures and device functionalities of computing device 106. At 1202, a "circle" gesture is mapped to a "tell me the weather" function, at 1204 a "v" gesture is mapped to an accept call function, at 1206 an "x" gesture is mapped to a "refuse call" function, at 1208 a "triangle" gesture is mapped to a "call home" function, at 1210 an "m" gesture is mapped to a "play music" function, and at 1212 a "w" gesture is mapped to a "silence call" function.

As noted above, the mappings at 1202, 1204, 1206, 1208, 1210, and 1212 may be created by the user or may be predefined such that the user does not need to first create and assign the gesture. Further, the user may be able to change or modify the mappings by selecting the mapping and creating a new gesture to replace the currently assigned gesture.

Notably, there may be a variety of different functionalities that the user may wish to initiate via a gesture to interactive textile 102. However, there is a limited number of different gestures that a user can realistically be expected to remember. Thus, in one or more implementations gesture manager 218 is configured to select a functionality based on both a gesture to interactive textile 102 and a context of computing device 106. The ability to recognize gestures based on context enables the user to invoke a variety of different functionalities using a subset of gestures. For example, for a first context, a first gesture may initiate a first functionality, whereas for a second context, the same first gesture may initiate a second functionality.

In some cases, the context of computing device 106 may be based on an application that is currently running on computing device 106. For example, the context may correspond to listening to music when the user is utilizing a music player application to listen to music, and to "receiving a call" when a call is communicated to computing device 106. In these cases, gesture manager 218 can determine the context by determining the application that is currently running on computing device 106.

Alternately or additionally, the context may correspond to an activity that the user is currently engaged in, such as running, working out, driving a car, and so forth. In these cases, gesture manager 218 can determine the context based on sensor data received from sensors implemented at computing device 106, interactive textile 102, or another device that is communicably coupled to computing device 106. For example, acceleration data from an accelerometer may indicate that the user is currently running, driving in a car, riding a bike, and so forth. Other non-limiting examples of determining context include determining the context based on calendar data (e.g., determining the user is in a meeting based on the user's calendar), determining context based on location data, and so forth.

After the context is determined, textile controller 204, at interactive textile 102, monitors for gesture input to interactive textile 102 woven into an item of clothing (e.g., a jacket) worn by the user, and generates touch data based on the gesture input. The touch data is then communicated to gesture manager 218.

In response to receiving the touch data from interactive textile 102, gesture manager 218 analyzes the touch data to identify the gesture. Then, gesture manager 218 initiates a functionality of computing device based on the gesture and the context. For example, gesture manager 218 can compare the gesture to a mapping that assigns gestures to different contexts. A given gesture, for example, may be associated with multiple different contexts and associated functionalities. Thus, when a first gesture is received, gesture manager 218 may initiate a first functionality if a first context is detected, or initiate a second, different functionality if a second, different context is detected.

Figure 13:
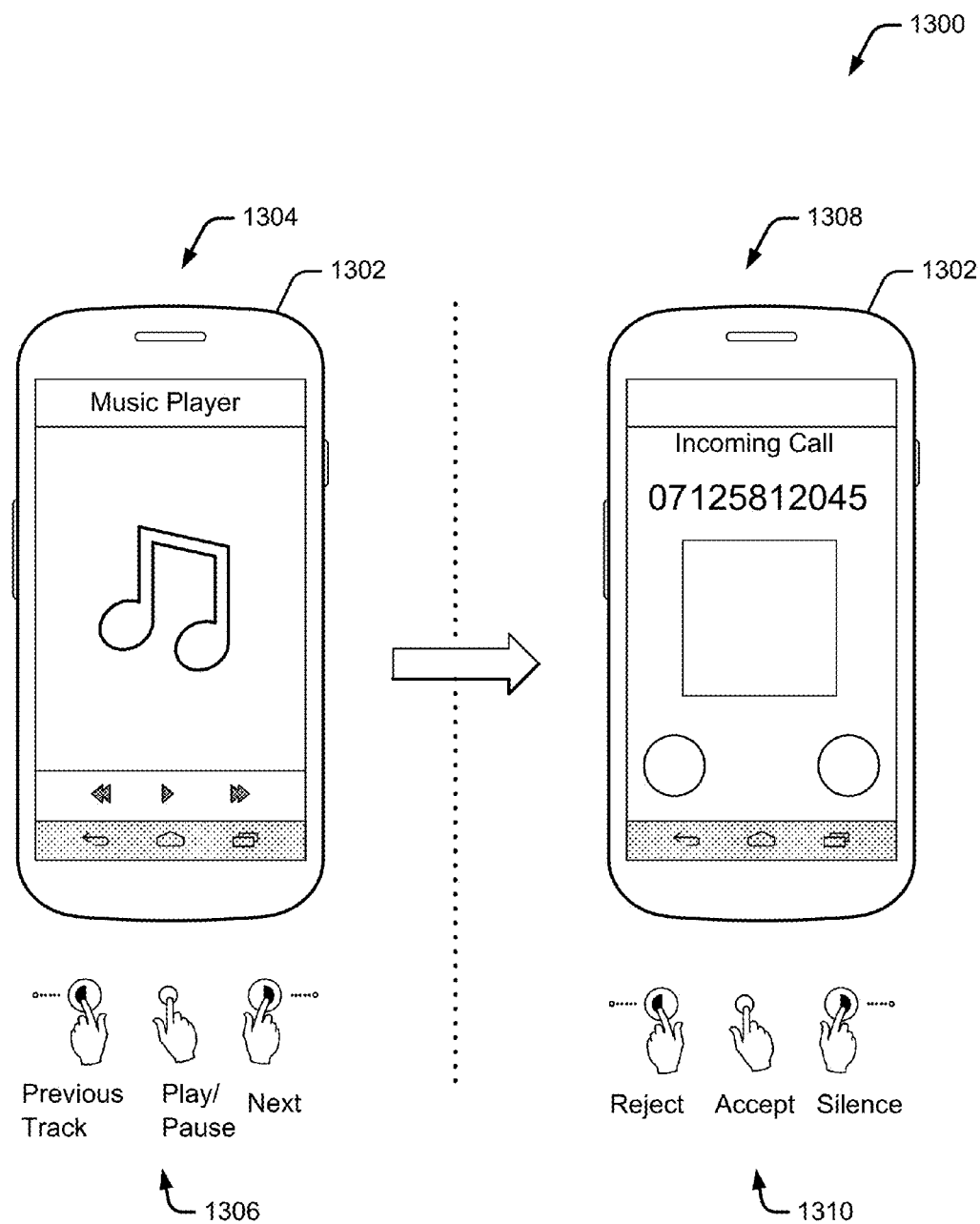
FIG. 13 illustrates an example of contextual-based gestures to an interactive textile in accordance with one or more implementations.

As an example, consider FIG. 13 which illustrates an example 1300 of contextual-based gestures to an interactive textile in accordance with one or more implementations.

In this example, computing device 106 is implemented as a smart phone 1302 that is communicably coupled to interactive textile 102. For example, interactive textile 102 may be woven into a jacket worn by the user, and coupled to smart phone 1302 via a wireless connection such as Bluetooth.

At 1304, smart phone 1302 is in a "music playing" context because a music player application is playing music on smart phone 1302. In the music playing context, gesture manager 218 has assigned a first subset of functionalities to a first subset of gestures at 1306. For example, the user can play a previous song by swiping left on interactive textile 102, play or pause a current song by tapping interactive textile 102, or play a next song by swiping right on interactive textile 102.

At 1308, the context of smart phone 1302 changes to an "incoming call" context when smart phone 1302 receives an incoming call. In the incoming call context, the same subset of gestures is assigned to a second subset of functionalities which are associated with the incoming call context at 1310. For example, by swiping left on interactive textile 102 the user can now reject the call, whereas before swiping left would have caused the previous song to be played in the music playing context. Similarly, by tapping interactive textile 102 the user can accept the call, and by swiping right on interactive textile 102 the user can silence the call.

In one or more implementations, interactive textile 102 further includes one or more output devices, such as one or more light sources (e.g., LED's), displays, speakers, and so forth. These output devices can be configured to provide feedback to the user based on touch-input to interactive textile 102 and/or notifications based on control signals received from computing device 106.

Figure 14:
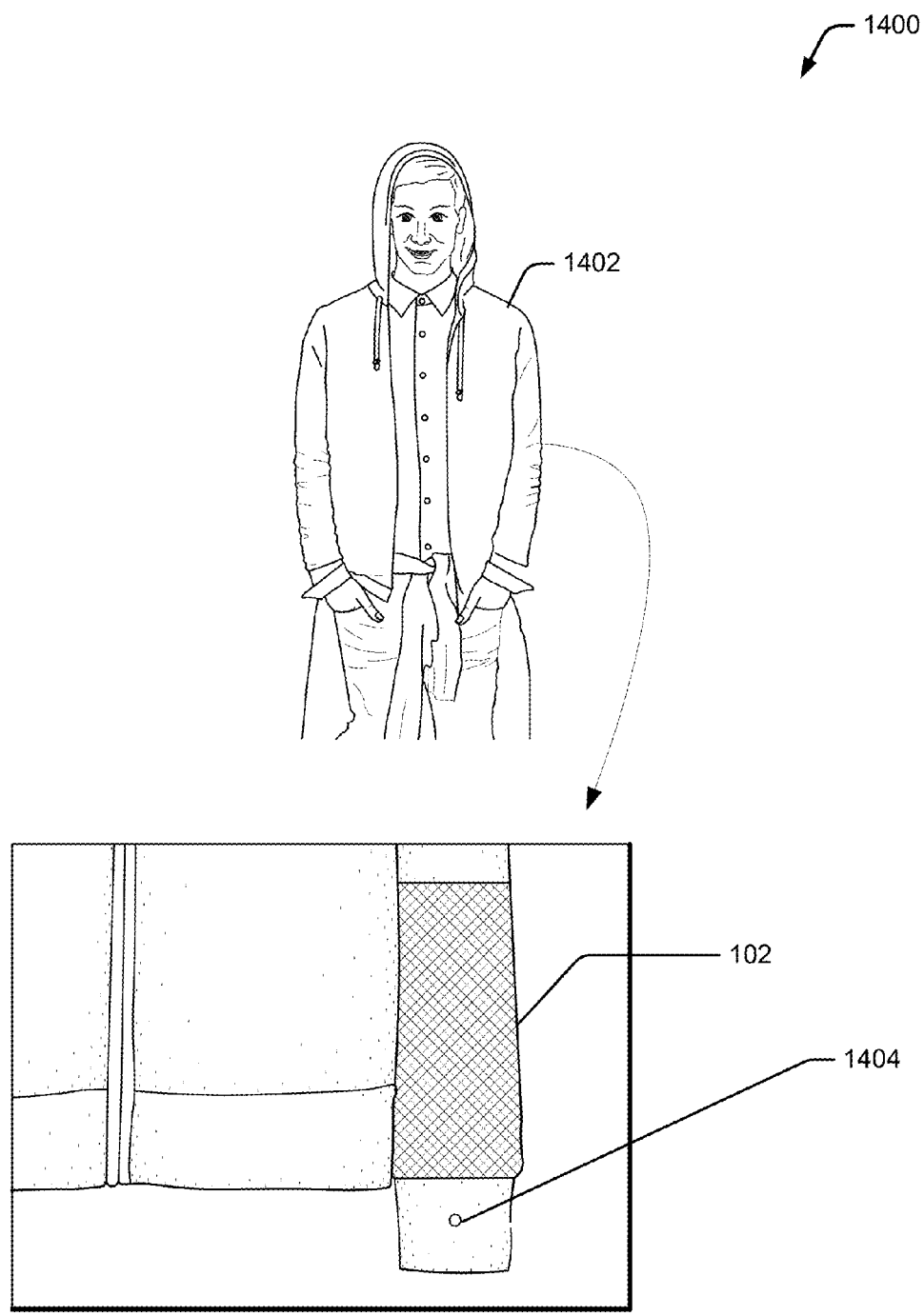
FIG. 14 illustrates an example of an interactive textile that includes an output device in accordance with one or more implementations.

FIG. 14 which illustrates an example 1400 of a jacket that includes an interactive textile 102 and an output device in accordance with one or more implementations. In this example, interactive textile 102 is integrated into the sleeve of a jacket 1402, and is coupled to a light source 1404, such as an LED, that is integrated into the cuff of jacket 1402.

Light source 1404 is configured to output light, and can be controlled by textile controller 204. For example, textile controller 204 can control a color and/or a frequency of the light output by light source 1404 in order to provide feedback to the user or to indicate a variety of different notifications. For example, textile controller 204 can cause the light source to flash at a certain frequency to indicate a particular notification associated with computing device 106, e.g., a phone call is being received, a text message or email message has been received, a timer has expired, and so forth. Additionally, textile controller 204 can cause the light source to flash with a particular color of light to provide feedback to the user that a particular gesture or input to interactive textile 102 has been recognized and/or that an associated functionality is activated based on the gesture.

Figure 15:
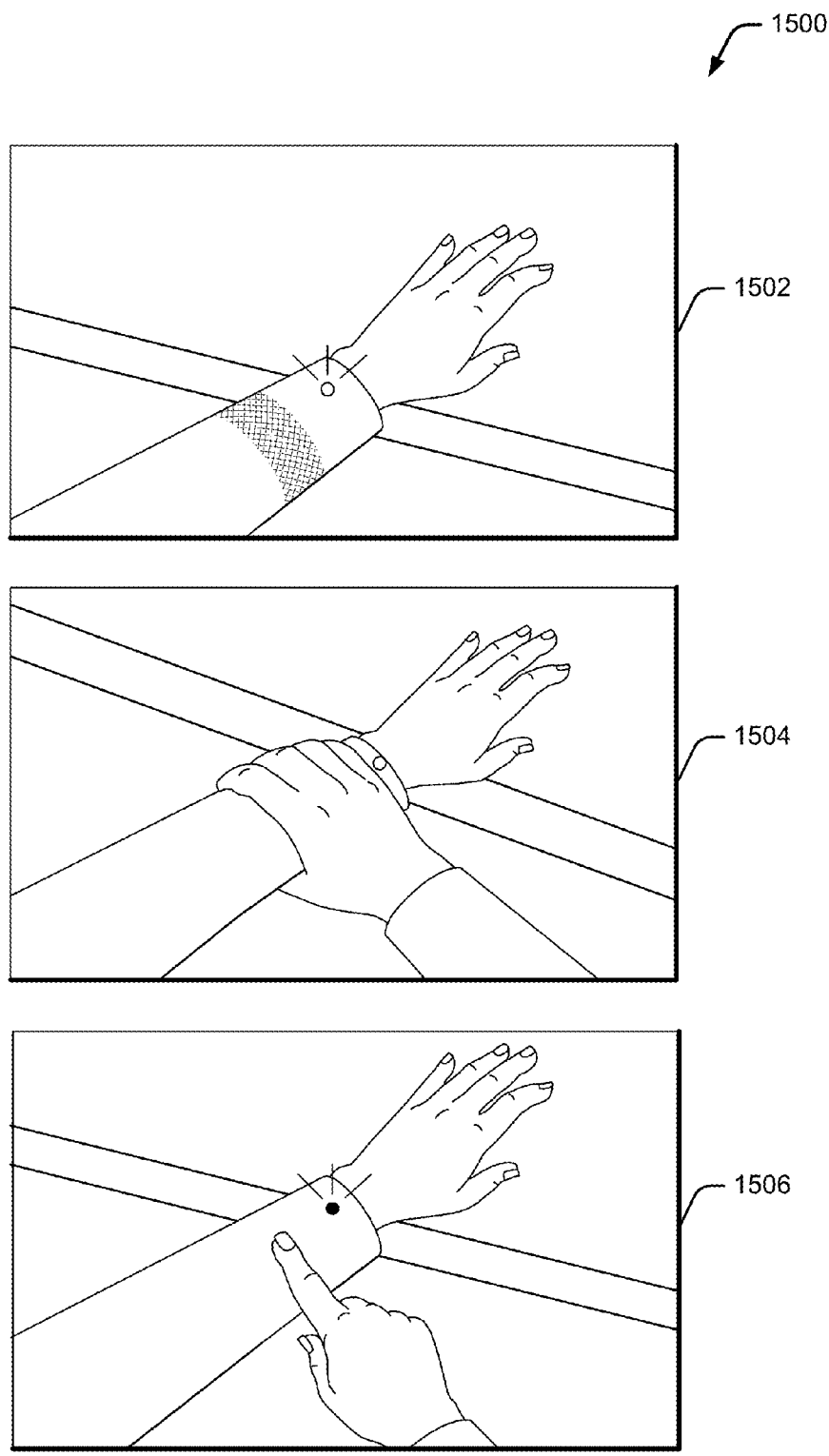
FIG. 15 illustrates implementation examples 1500 of interacting with an interactive textile and an output device in accordance with one or more implementations.

FIG. 15 illustrates implementation examples 1500 of interacting with an interactive textile and an output device in accordance with one or more implementations.

At 1502, textile controller 204 causes a light source to flash at a specific frequency to indicate a notification that is received from computing device 106, such as an incoming call or a text message.

At 1504, the user places his hand over interactive textile 102 to cover the interactive textile. This "cover" gesture may be mapped to a variety of different functionalities. For example, this gesture may be used to silence a call or to accept a call. In response, the light source can be controlled to provide feedback that the gesture is recognized, such as by turning off when the call is silenced.

At 1506, the user taps the touch sensor with a single finger to initiate a different functionality. For example, the user may be able to place one finger on the touch sensor to listen to a voicemail on computing device 106. In this case, the light source can be controlled to provide feedback that the gesture is recognized, such as by outputting orange light when the voicemail begins to play.

Having discussed interactive textiles 102, and how interactive textiles 102 detect touch-input, consider now a discussion of how interactive textiles 102 may be easily integrated within flexible objects 104, such as clothing, handbags, fabric casings, hats, and so forth.

Figure 16:
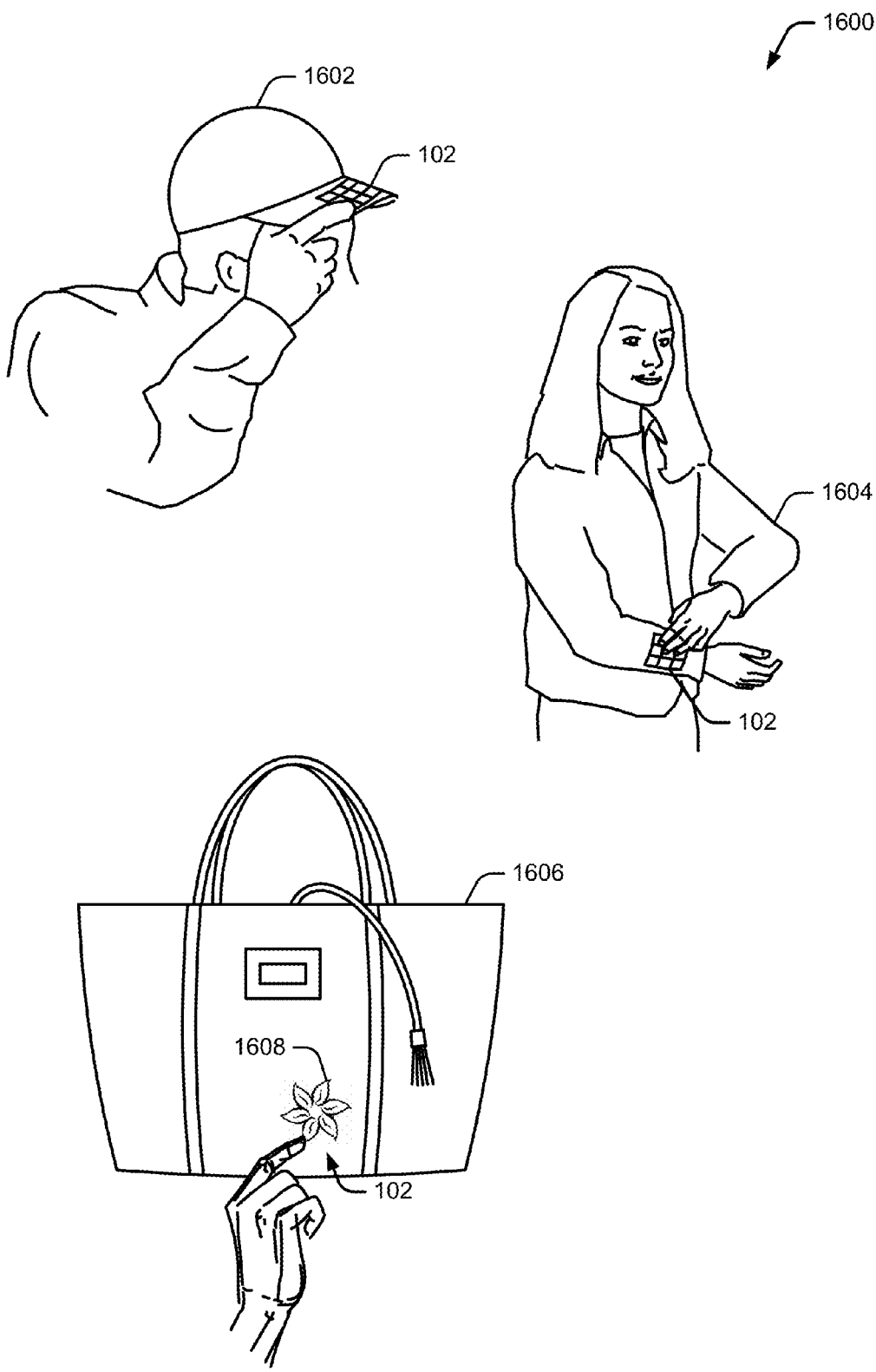
FIG. 16 illustrates various examples of interactive textiles integrated within flexible objects.

FIG. 16 illustrates various examples 1600 of interactive textiles integrated within flexible objects. Examples 1600 depict interactive textile 102 integrated in a hat 1602, a shirt 1604, and a handbag 1606.

Interactive textile 102 is integrated within the bill of hat 1602 to enable the user to control various computing devices 106 by touching the bill of the user's hat. For example, the user may be able to tap the bill of hat 1602 with a single finger at the position of interactive textile 102, to answer an incoming call to the user's smart phone, and to touch and hold the bill of hat 1602 with two fingers to end the call.

Interactive textile 102 is integrated within the sleeve of shirt 1604 to enable the user to control various computing devices 106 by touching the sleeve of the user's shirt. For example, the user may be able to swipe to the left or to the right on the sleeve of shirt 1604 at the position of interactive textile 102 to play a previous or next song, respectively, on a stereo system of the user's house.

In examples 1602 and 1604, the grid of conductive thread 208 is depicted as being visible on the bill of the hat 1602 and on the sleeve of shirt 1604. It is to be noted, however, that interactive textile 102 may be manufactured to be the same texture and color as object 104 so that interactive textile 102 is not noticeable on the object.

In some implementations, a patch of interactive textile 102 may be integrated within flexible objects 104 by sewing or gluing the patch of interactive textile 102 to flexible object 104. For example, a patch of interactive textile 102 may be attached to the bill of hat 1602, or to the sleeve of shirt 1604 by sewing or gluing the patch of interactive textile 102, which includes the grid of conductive thread 208, directly onto the bill of hat 1602 or the sleeve of shirt 1604, respectively. Interactive textile 102 may then be coupled to textile controller 204 and power source 206, as described above, to enable interactive textile 102 to sense touch-input.

In other implementations, conductive thread 208 of interactive textile 102 may be woven into flexible object 104 during the manufacturing of flexible object 104. For example, conductive thread 208 of interactive textile 102 may be woven with non-conductive threads on the bill of hat 1602 or the sleeve of a shirt 1604 during the manufacturing of hat 1602 or shirt 1604, respectively.

In one or more implementations, interactive textile 102 may be integrated with an image on flexible object 104. Different areas of the image may then be mapped to different areas of capacitive touch sensor 202 to enable a user to initiate different controls for computing device 106, or application 216 at computing device 106, by touching the different areas of the image. In FIG. 16, for example, interactive textile 102 is weaved with an image of a flower 1608 onto handbag 1606 using a weaving process such as jacquard weaving. The image of flower 1608 may provide visual guidance to the user such that the user knows where to touch the handbag in order to initiate various controls. For example, one petal of flower 1608 could be used to turn on and off the user's smart phone, another petal of flower 1608 could be used to cause the user's smart phone to ring to enable the user to find the smart phone when it is lost, and another petal of flower 1608 could be mapped to the user's car to enable the user to lock and unlock the car.

Similarly, in one or more implementations interactive textile 102 may be integrated with a three-dimensional object on flexible object 104. Different areas of the three-dimensional object may be mapped to different areas of capacitive touch sensor 202 to enable a user to initiate different controls for computing device 106, or application 216 at computing device 106, by touching the different areas of the three-dimensional object. For example, bumps or ridges can be created using a material such as velvet or corduroy and woven with interactive textile 102 onto object 104. In this way, the three-dimensional objects may provide visual and tactile guidance to the user to enable the user to initiate specific controls. A patch of interactive textile 102 may be weaved to form a variety of different 3D geometric shapes other than a square, such as a circle, a triangle, and so forth.

In various implementations, interactive textile 102 may be integrated within a hard object 104 using injection molding. Injection molding is a common process used to manufacture parts, and is ideal for producing high volumes of the same object. For example, injection molding may be used to create many things such as wire spools, packaging, bottle caps, automotive dashboards, pocket combs, some musical instruments (and parts of them), one-piece chairs and small tables, storage containers, mechanical parts (including gears), and most other plastic products available today.

Example Methods

FIGS. 17, 18, 19, and 20 illustrate an example method 1700 (FIG. 17) of generating touch data using an interactive textile, an example method 1800 (FIG. 18) of determining gestures usable to initiate functionality of a computing device, an example method 1900 (FIG. 19) of assigning a gesture to a functionality of a computing device, and an example method 2000 (FIG. 20) of initiating a functionality of a computing device based on a gesture and a context. These methods and other methods herein are shown as sets of blocks that specify operations performed but are not necessarily limited to the order or combinations shown for performing the operations by the respective blocks. In portions of the following discussion reference may be made to environment 100 of FIG. 1 and system 200 of FIG. 2, reference to which is made for example only. The techniques are not limited to performance by one entity or multiple entities operating on one device.

Figure 17:
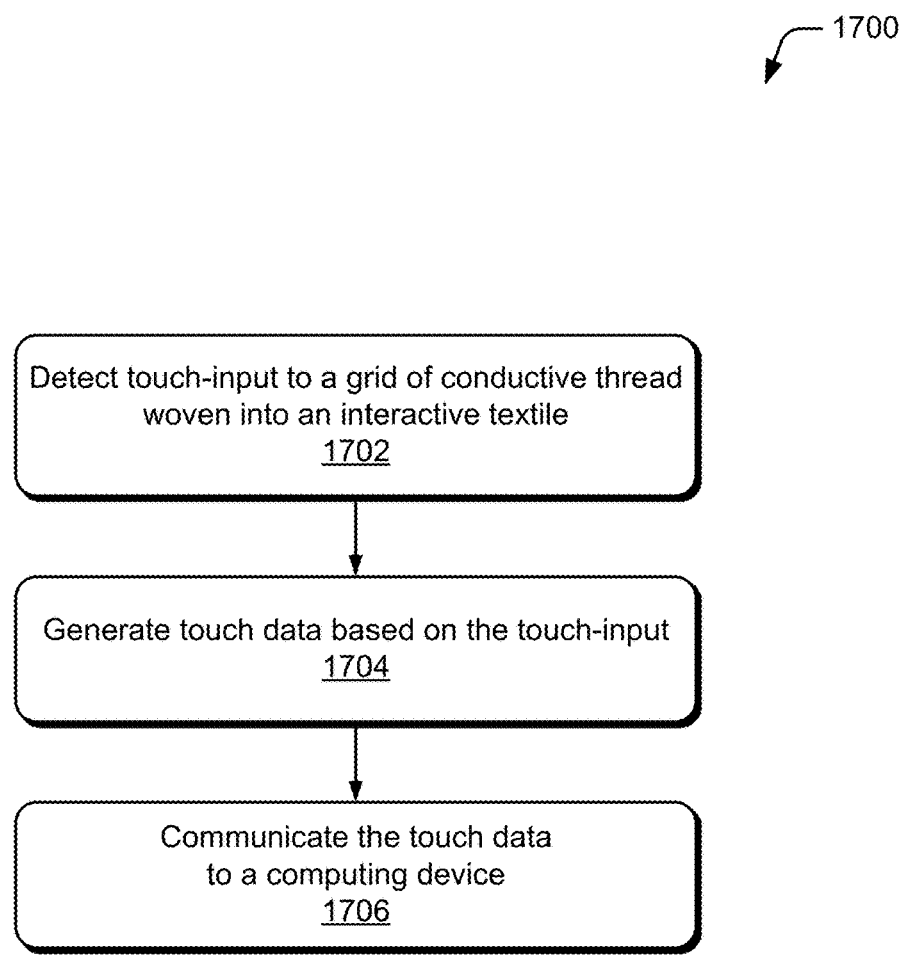
FIG. 17 illustrates an example method of generating touch data using an interactive textile.

FIG. 17 illustrates an example method 1700 of generating touch data using an interactive textile.

At 1702, touch-input to a grid of conductive thread woven into an interactive textile is detected. For example, textile controller 204 (FIG. 2) detects touch-input to the grid of conductive thread 208 woven into interactive textile 102 (FIG. 1) when an object, such as a user's finger, touches interactive textile 102.

Interactive textile 102 may be integrated within a flexible object, such as shirt 104-1, hat 104-2, or handbag 104-3. Alternately, interactive textile 102 may be integrated with a hard object, such as plastic cup 104-4 or smart phone casing 104-5.

At 1704, touch data is generated based on the touch-input. For example, textile controller 204 generates touch data based on the touch-input. The touch data may include a position of the touch-input on the grid of conductive thread 208.

As described throughout, the grid of conductive thread 208 may include horizontal conductive threads 208 and vertical conductive threads 208 positioned substantially orthogonal to the horizontal conductive threads. To detect the position of the touch-input, textile controller 204 can use self-capacitance sensing or projective capacitance sensing.

At 1706, the touch data is communicated to a computing device to control the computing device or one or more applications at the computing device. For example, network interface 210 at object 104 communicates the touch data generated by textile controller 204 to gesture manager 218 implemented at computing device 106. Gesture manager 218 and computing device 106 may be implemented at object 104, in which case interface may communicate the touch data to gesture manager 218 via a wired connection. Alternately, gesture manager 218 and computing device 106 may be implemented remote from interactive textile 102, in which case network interface 210 may communicate the touch data to gesture manager 218 via network 108.

Figure 18:
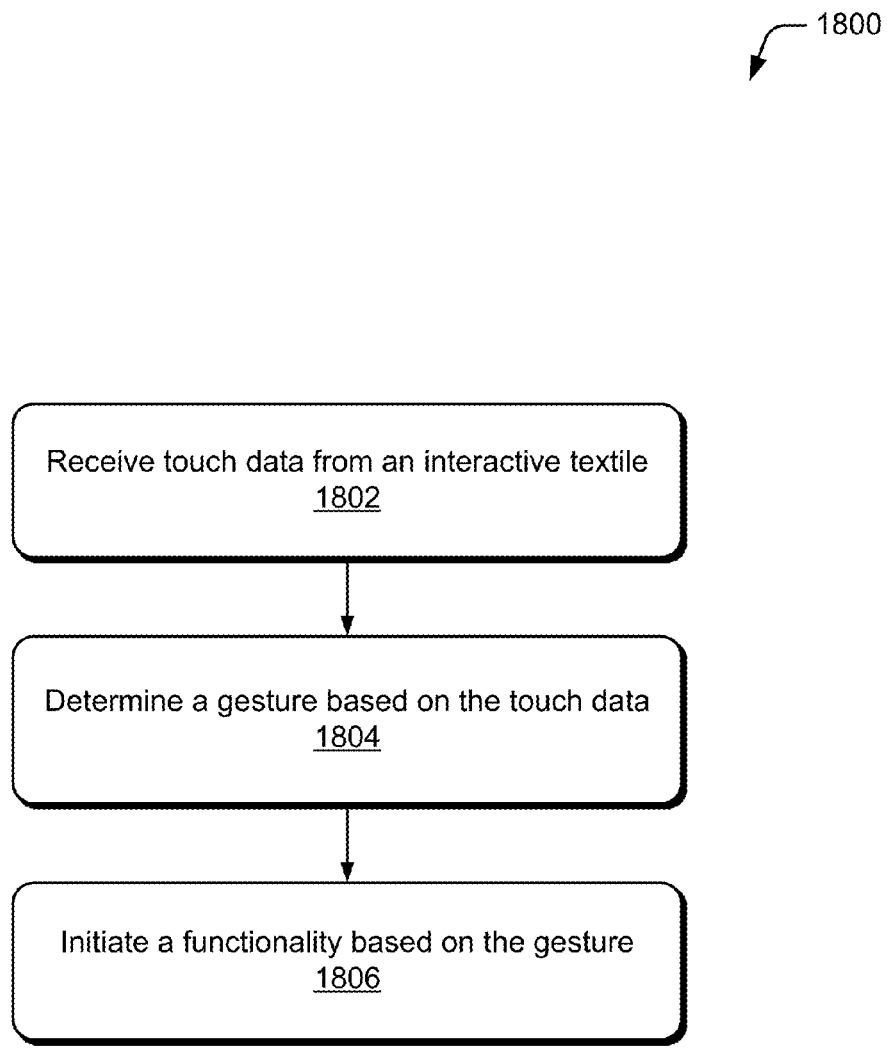
FIG. 18 illustrates an example method of determining gestures usable to initiate functionality of a computing device in accordance with one or more implementations.

FIG. 18 illustrates an example method 1800 of determining gestures usable to initiate functionality of a computing device in accordance with one or more implementations.

At 1802, touch data is received from an interactive textile. For example, network interface 222 (FIG. 2) at computing device 106 receives touch data from network interface 210 at interactive textile 102 that is communicated to gesture manager 218 at step 906 of FIG. 9.

At 1804, a gesture is determined based on the touch data. For example, gesture manager 218 determines a gesture based on the touch data, such as single-finger touch gesture 506, a double-tap gesture 516, a two-finger touch gesture 526, a swipe gesture 538, and so forth.

At 1806, a functionality is initiated based on the gesture. For example, gesture manager 218 generates a control based on the gesture to control an object 104, computing device 106, or an application 216 at computing device 106. For example, a swipe up gesture may be used to increase the volume on a television, turn on lights in the user's house, open the automatic garage door of the user's house, and so on.

Figure 19:
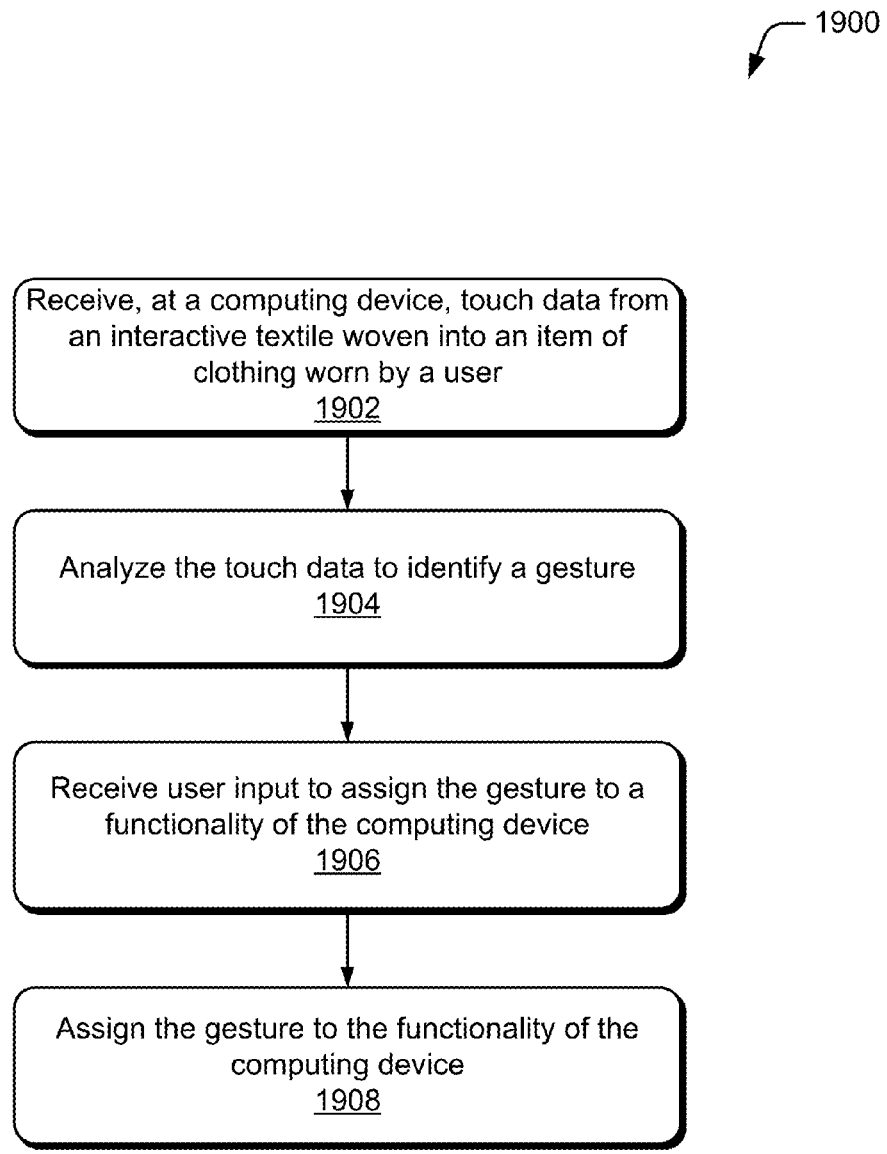
FIG. 19 illustrates an example method 1900 of assigning a gesture to a functionality of a computing device in accordance with one or more implementations.

FIG. 19 illustrates an example method 1900 of assigning a gesture to a functionality of a computing device in accordance with one or more implementations.

At 1902, touch data is received at a computing device from an interactive textile woven into an item of clothing worn by the user. For example, network interface 222 (FIG. 2) at computing device 106 receives touch data from network interface 210 at interactive textile 102 that is woven into an item of clothing worn by a user, such as a jacket, shirt, hat, and so forth.

At 1904, the touch data is analyzed to identify a gesture. For example, gesture manager 218 analyzes the touch data to identify a gesture, such as a touch, tap, swipe, hold, or gesture stroke.

At 1906, user input to assign the gesture to a functionality of the computing device is received. For example, gesture manager 218 receives user input to assign function user interface 1112 to assign the gesture created at step 1904 to a functionality of computing device 106.

At 1908, the gesture is assigned to the functionality of the computing device. For example, gesture manager 218 assigns the functionality selected at step 1906 to the gesture created at step 1904.

Figure 20:
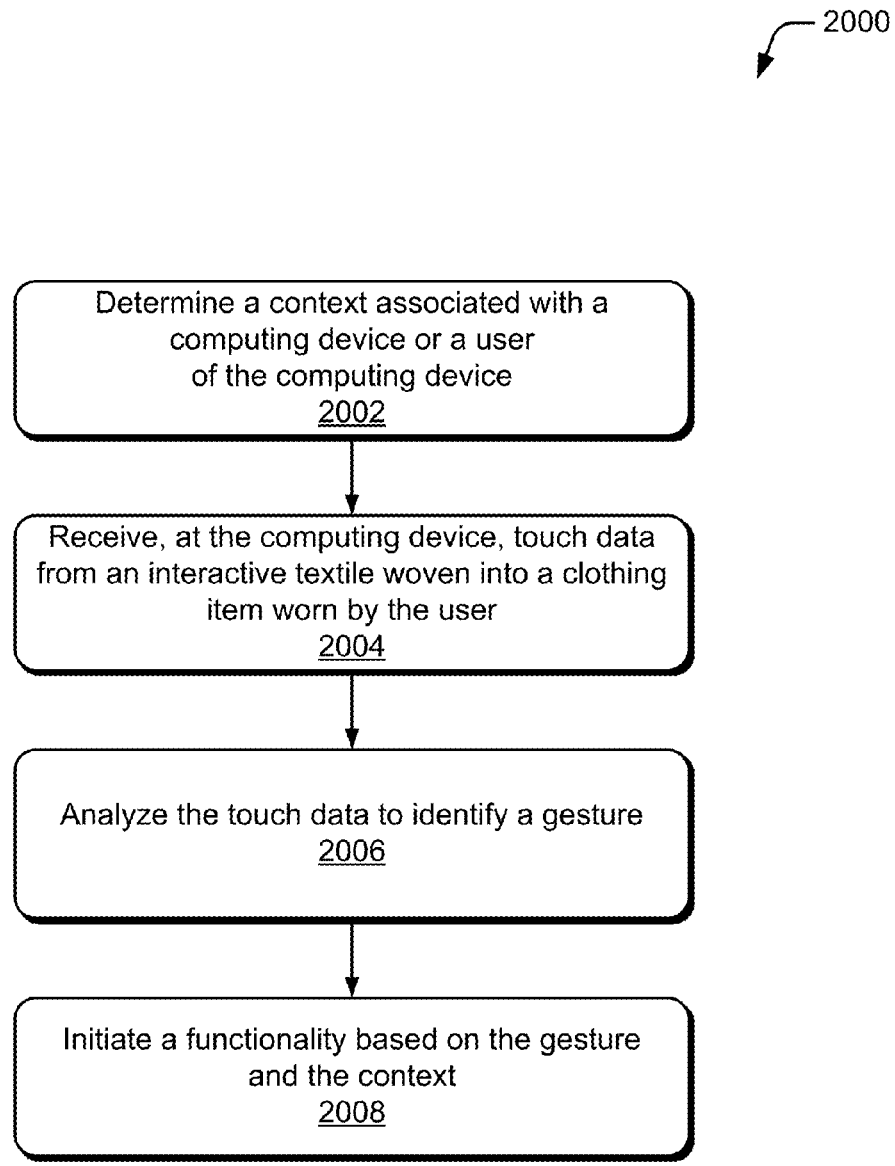
FIG. 20 illustrates an example method 2300 of initiating a functionality of a computing device based on a gesture and a context in accordance with one or more implementations.

FIG. 20 illustrates an example method 2000 of initiating a functionality of a computing device based on a gesture and a context in accordance with one or more implementations.

At 2002, a context associated with a computing device or a user of the computing device is determined. For example, gesture manager 218 determines a context associated with computing device 106 or a user of computing device 106.

At 2004, touch data is received at the computing device from an interactive textile woven into a clothing item worn by the user. For example, touch data is received at computing device 106 from interactive textile 102 woven into a clothing item worn by the user, such as jacket, shirt, or hat.

At 2006, the touch data is analyzed to identify a gesture. For example, gesture manager 218 analyzes the touch data to identify a gesture, such as a touch, tap, swipe, hold, stroke, and so forth.

At 2008, a functionality is activated based on the gesture and the context. For example, gesture manager 218 activates a functionality based on the gesture identified at step 2006 and the context determined at step 2002.

The preceding discussion describes methods relating to gestures for interactive textiles. Aspects of these methods may be implemented in hardware (e.g., fixed logic circuitry), firmware, software, manual processing, or any combination thereof. These techniques may be embodied on one or more of the entities shown in FIGS. 1-16 and 21 (computing system 2100 is described in FIG. 21 below), which may be further divided, combined, and so on. Thus, these figures illustrate some of the many possible systems or apparatuses capable of employing the described techniques. The entities of these figures generally represent software, firmware, hardware, whole devices or networks, or a combination thereof.

Example Computing System

Figure 21:
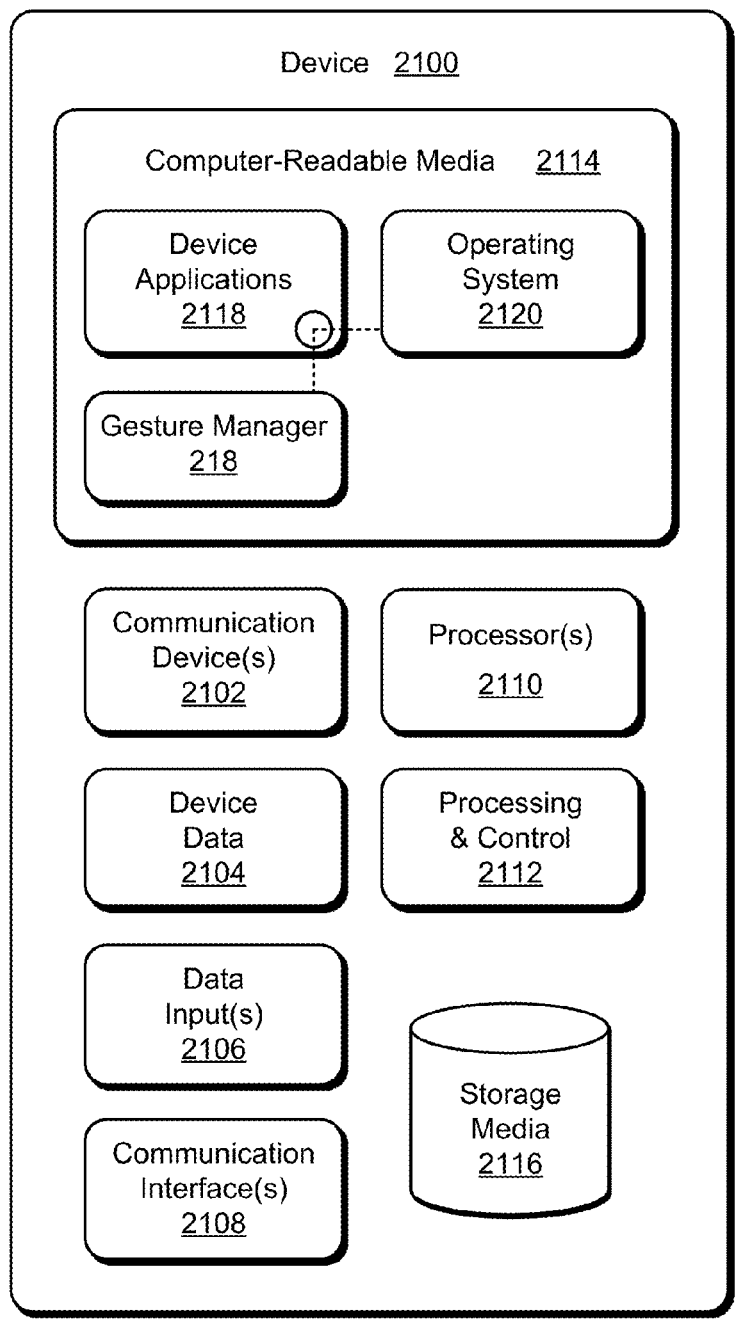
FIG. 21 illustrates various components of an example computing system that can be implemented as any type of client, server, and/or computing device as described with reference to the previous FIGS. 1-20 to implement two-layer interactive textiles.

FIG. 21 illustrates various components of an example computing system 2100 that can be implemented as any type of client, server, and/or computing device as described with reference to the previous FIGS. 1-20 to implement two-layer interactive textiles. In embodiments, computing system 2100 can be implemented as one or a combination of a wired and/or wireless wearable device, System-on-Chip (SoC), and/or as another type of device or portion thereof. Computing system 2100 may also be associated with a user (e.g., a person) and/or an entity that operates the device such that a device describes logical devices that include users, software, firmware, and/or a combination of devices.

Computing system 2100 includes communication devices 2102 that enable wired and/or wireless communication of device data 2104 (e.g., received data, data that is being received, data scheduled for broadcast, data packets of the data, etc.). Device data 2104 or other device content can include configuration settings of the device, media content stored on the device, and/or information associated with a user of the device. Media content stored on computing system 2100 can include any type of audio, video, and/or image data. Computing system 2100 includes one or more data inputs 2106 via which any type of data, media content, and/or inputs can be received, such as human utterances, touch data generated by interactive textile 102, user-selectable inputs (explicit or implicit), messages, music, television media content, recorded video content, and any other type of audio, video, and/or image data received from any content and/or data source.

Computing system 2100 also includes communication interfaces 2108, which can be implemented as any one or more of a serial and/or parallel interface, a wireless interface, any type of network interface, a modem, and as any other type of communication interface. Communication interfaces 2108 provide a connection and/or communication links between computing system 2100 and a communication network by which other electronic, computing, and communication devices communicate data with computing system 2100.

Computing system 2100 includes one or more processors 2110 (e.g., any of microprocessors, controllers, and the like), which process various computer-executable instructions to control the operation of computing system 2100 and to enable techniques for, or in which can be embodied, interactive textiles. Alternatively or in addition, computing system 2100 can be implemented with any one or combination of hardware, firmware, or fixed logic circuitry that is implemented in connection with processing and control circuits which are generally identified at 2112. Although not shown, computing system 2100 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Computing system 2100 also includes computer-readable media 2114, such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Computing system 2100 can also include a mass storage media device 2116.

Computer-readable media 2114 provides data storage mechanisms to store device data 2104, as well as various device applications 2118 and any other types of information and/or data related to operational aspects of computing system 2100. For example, an operating system 2120 can be maintained as a computer application with computer-readable media 2114 and executed on processors 2110. Device applications 2118 may include a device manager, such as any form of a control application, software application, signal-processing and control module, code that is native to a particular device, a hardware abstraction layer for a particular device, and so on.

Device applications 2118 also include any system components, engines, or managers to implement interactive textiles. In this example, device applications 2118 include gesture manager 218.

CONCLUSION

Although embodiments of techniques using, and objects including, two-layer interactive textiles have been described in language specific to features and/or methods, it is to be understood that the subject of the appended claims is not necessarily limited to the specific features or methods described. Rather, the specific features and methods are disclosed as example implementations of two-layer interactive textiles.

What is claimed is:

1. An interactive textile configured to be integrated within a flexible object, the interactive textile comprising:
   a top textile layer comprising first conductive threads woven into the top textile layer;
   a bottom textile layer comprising second conductive threads woven into the bottom textile layer, the bottom textile layer coupled to the first textile layer effective to cause the first conductive threads and the second conductive threads to form a capacitive touch sensor having a grid of crossing conductive threads, at least two adjacent conductive threads of the second conductive threads in the bottom textile layer having a pitch that varies based on a weaving between the bottom textile layer and the top textile layer; and
   a textile controller coupled to the capacitive touch sensor, the textile controller configured to detect a position of a touch-input to the grid of conductive threads when an object touches the grid of conductive threads, and process the position of the touch-input to provide touch data usable to control a computing device wirelessly coupled to the interactive textile.

2. The interactive textile as recited in claim 1, wherein the textile controller is coupled to the capacitive touch sensor via the second conductive threads of the bottom textile layer.

3. The interactive textile as recited in claim 1, wherein the first conductive threads woven into the top textile layer are positioned substantially orthogonal to the second conductive threads woven into the second textile layer to form the grid of conductive threads.

4. The interactive textile as recited in claim 1, wherein the second conductive threads are partially woven into the second textile layer.

5. The interactive textile as recited in claim 1, wherein the first textile layer and the second textile layer are combined using a 3D-weaving process.

6. The interactive textile as recited in claim 1, wherein the flexible object comprises a clothing item.

7. The interactive textile as recited in claim 6, wherein the first textile layer comprises an outside surface of the clothing item.

8. The interactive textile as recited in claim 1, wherein the second textile layer comprises a standardized structure of second conductive threads.

9. The interactive textile as recited in claim 1, wherein the first and second conductive threads each comprise a conductive wire that is twisted, wrapped, or braided with one or more flexible threads.

10. The interactive textile as recited in claim 9, wherein the conductive wire comprises a copper wire, a gold wire, or a silver wire.

11. A flexible object comprising:
    an interactive textile integrated within the flexible object, the interactive textile comprising a top textile layer coupled to a bottom textile layer, the top textile layer comprising first conductive threads woven into the top textile layer and the bottom textile layer comprising second conductive threads woven into the bottom textile layer, the first conductive threads and the second conductive threads forming a grid of conductive threads, a pitch between at least two adjacent conductive threads of the second conductive threads being varied based on a weaving between the bottom textile layer and the top textile layer; and
    a textile controller coupled to the interactive textile, the textile controller configured to detect a position of a touch-input to the grid of conductive threads, and process the position of the touch-input to provide touch data usable to initiate functionality of a computing device wirelessly coupled to the interactive textile.

12. The flexible object as recited in claim 11, wherein the textile controller is coupled to the interactive textile via the second conductive threads of the bottom textile layer.

13. The flexible object as recited in claim 11, wherein the flexible object comprises a clothing item.

14. The flexible object as recited in claim 11, wherein the second conductive threads and the textile controller are not visible when the clothing item is worn by a user.

15. The flexible object as recited in claim 11, wherein the first textile layer and the second textile layer are combined using a 3D-weaving process.

16. The flexible object as recited in claim 11, wherein:
    the second conductive threads are partially woven into the second textile layer.

17. The flexible object as recited in claim 11, wherein the textile controller is configured to detect the position of the touch-input to the grid of conductive threads based on a change in capacitance of one or more touched conductive threads in the grid of conductive threads.

18. The flexible object as recited in claim 17, wherein the change in capacitance is used to identify a presence of an object that touches the one or more touched conductive threads.

19. The flexible object as recited in claim 17, wherein the textile controller is configured to detect the position of the touch-input to the grid of conductive threads as X, Y coordinates on the grid of conductive thread.

20. The flexible object as recited in claim 11, wherein the second conductive threads include a first subset of conductive threads in a first direction and a second subset of threads in a second direction that is different than the first direction, the first subset of conductive threads being charged and the second subset of conductive threads implemented as a virtual ground by not being charged.

* * * * *